United States Patent
Iwasaki et al.

(10) Patent No.: US 6,818,104 B2
(45) Date of Patent: Nov. 16, 2004

(54) ANODIZING APPARATUS

(75) Inventors: Yukiko Iwasaki, Kanagawa-ken (JP); Shoji Nishida, Kanagawa-ken (JP); Kiyofumi Sakaguchi, Kanagawa-ken (JP); Noritaka Ukiyo, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/669,002

(22) Filed: Sep. 24, 2003

(65) Prior Publication Data

US 2004/0055894 A1 Mar. 25, 2004

Related U.S. Application Data

(62) Division of application No. 09/586,887, filed on Jun. 5, 2000, now Pat. No. 6,664,169.

(30) Foreign Application Priority Data

Jun. 8, 1999 (JP) ............................................. 11-161110
Jun. 8, 1999 (JP) ............................................. 11-161111

(51) Int. Cl.$^7$ ........................ C25D 17/00; C25D 11/00; C23F 13/00; C23C 28/00; H01L 21/44
(52) U.S. Cl. ...................... 204/199; 204/193; 204/194; 204/196.28; 204/199; 204/668; 204/669; 205/199; 205/323; 438/678
(58) Field of Search .................. 205/323, 199; 438/678; 204/193, 194, 196.28, 199, 237, 238, 256, 270, 277, 279, 297.05, 297.13, 668, 669, 671, 272

(56) References Cited

U.S. PATENT DOCUMENTS 5,565,084 A   10/1996  Lee et al.
5,811,348 A    9/1998  Matsushita et al.
5,856,229 A    1/1999  Sakaguchi et al.
6,143,628 A   11/2000  Sato et al.
6,190,937 B1   2/2001  Nakagawa et al.
6,194,239 B1 * 2/2001  Tayanaka ..................... 438/28
6,211,038 B1   4/2001  Nakagawa et al.

(List continued on next page.)

FOREIGN PATENT DOCUMENTS

| EP | 0793263 | 9/1997 |
|---|---|---|
| EP | 0840381 | 5/1998 |
| EP | 0989616 | 3/2000 |
| JP | 7-302889 | 11/1995 |
| JP | 8-213645 | 8/1996 |
| JP | 10-190032 | 7/1998 |

OTHER PUBLICATIONS

R.P. Holmstrom, et al., "Complete dielectric isolation by highly selective and self-stopping formation of oxidized porous silicon", Appl. Phys. Lett., vol. 42, No. 4, pp. 386–388 (1983).

Y. Nakagawa, et al., "Bulk-wave generation due to the nonlinear interaction of surface acoustic waves", J. Appl. Phys., vol. 49, No. 12, pp. 5924–5927 (1978).

*Primary Examiner*—John F. Niebling
*Assistant Examiner*—Stanetta Isaac
(74) *Attorney, Agent, or Firm*—Fitzpatrick, Cella, Harper & Scinto

(57) ABSTRACT

In a process for producing a semiconductor member, and a solar cell, making use of a thin-film crystal semiconductor layer, the process includes the steps of: (1) anodizing the surface of a first substrate to form a porous layer at least on one side of the substrate, (2) forming a semiconductor layer at least on the surface of the porous layer, (3) removing the semiconductor layer at its peripheral region, (4) bonding a second substrate to the surface of the semiconductor layer, (5) separating the semiconductor layer from the first substrate at the part of the porous layer, and (6) treating the surface of the first substrate after separation and repeating the above steps (1) to (5).

7 Claims, 12 Drawing Sheets

U.S. PATENT DOCUMENTS

| | | | |
|---|---|---|---|
| 6,214,701 B1 * | 4/2001 | Matsushita et al. | 438/458 |
| 6,221,738 B1 | 4/2001 | Sakaguchi et al. | |
| 6,258,698 B1 | 7/2001 | Iwasaki et al. | |
| 6,306,729 B1 | 10/2001 | Sakaguchi et al. | |
| 6,331,208 B1 | 12/2001 | Nishida et al. | |
| 6,376,332 B1 | 4/2002 | Yanagita et al. | |
| 6,382,292 B1 | 5/2002 | Ohmi et al. | |
| 6,387,227 B1 * | 5/2002 | Hamanaka et al. | 204/206 |
| 6,391,743 B1 | 5/2002 | Iwane et al. | |
| 6,428,620 B1 | 8/2002 | Yamagata et al. | |
| 6,613,678 B1 | 9/2003 | Sakaguchi et al. | |

* cited by examiner

SEPARATING FORCE

SEPARATING FORCE

ANODIZING APPARATUS

This is a divisional application of application Ser. No. 09/586,887, filed Jun. 5, 2000 now U.S. Pat. No. 6,664,169.

BACKGROUND OF THE INVENTION

1. Field of the Invention

This invention relates to a method of separating a semiconductor thin film deposited on a porous layer, a process for producing a semiconductor member, a process for producing a solar cell formed of a thin-film single crystal layered on a low-cost substrate, and an anodizing apparatus used in these.

2. Related Background Art

A technique is known in which a thin-film semiconductor layer is formed on a porous layer formed at the surface portion or layer of a semiconductor substrate and thereafter the semiconductor layer is separated at the part of the porous layer. As a separation method, used is a chemical method making use of etching or a physical method of causing ultrasonic waves or force such as tensile force to act on.

With regard to the physical method, Japanese Patent Application Laid-Open No. 7-302889 discloses that a porous layer is formed at the surface of a silicon wafer, thereafter an epitaxial growth layer is formed thereon, another wafer is bonded to the epitaxial growth layer (silicon layer), and a pressure, a shear force or ultrasonic waves is/are applied to the porous layer to make separation. Japanese Patent Application Laid-Open No. 8-213645 also discloses that a porous layer is formed at the surface of a single-crystal silicon substrate, thereafter a p-n junction layer is formed thereon, the single-crystal silicon substrate is, on its back, fastened to a jig through an adhesive, another jig is bonded to the epitaxial growth layer, and both the jigs are pulled against each other to cause the porous layer to break to obtain a thin-film epitaxial growth layer (a solar cell). Japanese Patent Application Laid-Open No. 10-190032 discloses that a difference in shrink between a silicon layer and a plastic substrate bonded to the silicon layer is utilized to separate the former from the latter by cooling them with a vapor of liquid nitrogen.

However, when the thin-film epitaxial growth layer is obtained by separating it at the part of the porous layer, the thin-film semiconductor layer may finely be cracked or broken on the periphery of a region where it is to be separated (i.e., a separating region), because of an impact produced when the porous layer formed at the surface of the first substrate is broken by separating force. Where it is thus cracked or broken, not only the thin film can be handled with difficulty but also, when cracked or broken up to the central area, the yield and characteristics of devices including solar cells may lower.

SUMMARY OF THE INVENTION

An object of the present invention is to provide a process for producing a semiconductor member and a solar cell, which process enables separation of the thin-film semiconductor layer at a small force while causing less cracks, breaks or defects to be brought into it and can manufacture high-performance semiconductor members and solar cells in a good efficiency.

To achieve the above object, the present invention provides a process for producing a semiconductor member making use of a thin-film crystal semiconductor layer, the process comprising the steps of:

(1) anodizing the surface of a first substrate to form a porous layer at least on one side of the substrate;

(2) forming a semiconductor layer at least on the surface of the porous layer;

(3) removing the semiconductor layer at its peripheral region;

(4) bonding a second substrate to the surface of the semiconductor layer;

(5) separating the semiconductor layer from the first substrate at the part of the porous layer by applying an external force to at least one of the first substrate, the porous layer and the second substrate; and (6) treating the surface of the first substrate after separation and repeating the above steps (1) to (5).

The present invention also provides a process for producing a semiconductor member making use of a thin-film crystal semiconductor layer, the process comprising the steps of:

(1) anodizing the surface of a first substrate to form a porous layer at least on one side of the substrate;

(2) forming a semiconductor layer at least on the surface of the porous layer;

(3) bonding a second substrate to the semiconductor layer;

(4) removing the semiconductor layer at its region not covered with the second substrate;

(5) separating the semiconductor layer from the first substrate at the part of the porous layer by applying an external force to at least one of the first substrate, the porous layer and the second substrate; and (6) treating the surface of the first substrate after separation and repeating the above steps (1) to (5).

The present invention still also provides a process for producing a solar cell making use of a thin-film crystal semiconductor layer, the process comprising the steps of:

(1) anodizing the surface of a first substrate to form a porous layer at least on one side of the substrate;

(2) forming a semiconductor layer at least on the surface of the porous layer;

(3) removing the semiconductor layer at its peripheral region;

(4) bonding a second substrate to the surface of the semiconductor layer;

(5) separating the semiconductor layer from the first substrate at the part of the porous layer by applying an external force to at least one of the first substrate, the porous layer and the second substrate; and (6) treating the surface of the first substrate after separation and repeating the above steps (1) to (5).

The present invention further provides a process for producing a solar cell making use of a thin-film crystal semiconductor layer, the process comprising the steps of:

(1) anodizing the surface of a first substrate to form a porous layer at least on one side of the substrate;

(2) forming a semiconductor layer at least on the surface of the porous layer;

(3) bonding a second substrate to the semiconductor layer;

(4) removing the semiconductor layer at its region not covered with the second substrate;

(5) separating the semiconductor layer from the first substrate at the part of the porous layer by applying an external force to at least one of the first substrate, the porous layer and the second substrate; and (6) treating the surface of the first substrate after separation and repeating the above steps (1) to (5).

The present invention still further provides a process for producing a semiconductor member obtained by separating a thin-film crystal semiconductor layer formed on a first substrate to transfer the former to a second substrate, wherein the thin-film crystal semiconductor layer is removed by etching by electropolishing at its part on the periphery of the first substrate.

The present invention still further provides a process for producing a semiconductor member making use of a thin-film crystal semiconductor layer, the process comprising the steps of:

(1) anodizing the surface of a first substrate at least on its principal-surface side to form a porous layer;

(2) forming a semiconductor layer on the surface of the porous layer;

(3) removing the semiconductor layer at its part on the periphery of the first substrate by electropolishing;

(4) bonding a second substrate to the surface of the semiconductor layer;

(5) separating the semiconductor layer from the first substrate at the part of the porous layer to transfer the semiconductor layer to the second substrate; and (6) treating the surface of the first substrate after separation and repeating the above steps (1) to (5).

The above process may further comprise, between the steps (5) and (6), the step of forming a semiconductor junction on the surface of the semiconductor layer having been transferred to the second substrate.

The second substrate may comprise a flexible film, and force that acts in the direction where the film is separated from the first substrate may be applied to separate the semiconductor layer at the part of the porous layer. The flexible film may comprise a resinous film.

The present invention still further provides a process for producing a solar cell obtained by separating a thin-film crystal semiconductor layer formed on a first substrate to transfer the former to a second substrate, wherein the thin-film crystal semiconductor layer is removed by etching by electropolishing at its part on the periphery of the first substrate.

The present invention still further provides a process for producing a solar cell making use of a thin-film crystal semiconductor layer, the process comprising the steps of:

(1) anodizing the surface of a first substrate at least on its principal-surface side to form a porous layer;

(2) forming a semiconductor layer on the surface of the porous layer;

(3) removing the semiconductor layer and the porous layer at their part on the periphery of the first substrate by electropolishing;

(4) forming a surface anti-reflection layer on the surface of the semiconductor layer at its part other than that on the periphery of the first substrate;

(5) bonding a second substrate to the surface of the semiconductor layer;

(6) separating the semiconductor layer from the first substrate at the part of the porous layer to transfer the semiconductor layer to the second substrate; and (7) treating the surface of the first substrate after separation and repeating the above steps (1) to (6).

The above process may further comprise, between the steps (6) and (7), the step of forming a semiconductor junction on the surface of the semiconductor layer having been transferred to the second substrate.

The second substrate may comprise a flexible film, and force that acts in the direction where the film is separated from the first substrate may be applied to separate the semiconductor layer at the part of the porous layer. The flexible film may comprise a resinous film.

The present invention still further provides an anodizing apparatus comprising, at the peripheral portion of a substrate to be subjected to anodizing, a first electrode coming in contact with the back side of the substrate and a second electrode facing the first electrode, interposing the substrate between them; the first electrode having substantially the same form as the second electrode.

The present invention still further provides an anodizing apparatus comprising, at the peripheral portion of a substrate to be subjected to anodizing, a first electrode coming in contact with the back side of the substrate and a second electrode facing the first electrode, interposing the substrate between them, and, in the remaining substrate region excluding the peripheral portion, a third electrode coming in contact with the back side of the substrate and a fourth electrode facing the third electrode, interposing the substrate between them; the first electrode and third electrode having substantially the same form as the second electrode and fourth electrode, respectively.

DETAILED DESCRIPTION OF THE PREFERRED EMBODIMENTS

Embodiments of the present invention will be described below in detail.

(Embodiment 1)

As an embodiment according to the present invention, a process for producing a semiconductor member is described with reference to FIGS. 1A to 1H.

Figure 1A:
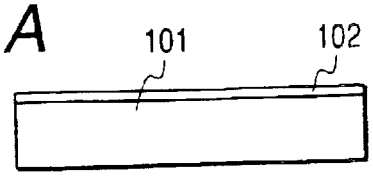
FIGS. 1A, 1B, 1C, 1D, 1E, 1F, 1G and 1H illustrate an example of a thin-film semiconductor production process according to the present invention, which is a process carried out in Example 1.

Into the surface portion or layer of a first-substrate crystal substrate as exemplified by a single-crystal silicon wafer 101, impurities are introduced by thermal diffusion or ion implantation or are incorporated when the wafer is produced, to form a $p^+$-type (or $n^+$-type) layer 102 at least at the wafer surface (FIG. 1A).

Figure 1B:
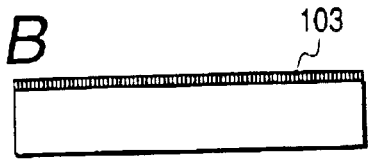

Next, the wafer surface on the side the impurities have been introduced is subjected to anodizing in, e.g., an aqueous HF (hydrogen fluoride) solution to make the surface and the vicinity thereof porous to form a porous layer 103 (FIG. 1B).

Figure 1C:

This porous layer 103 is subjected to hydrogen annealing to make its surface smooth, followed by CVD (chemical vapor deposition) or liquid-phase epitaxial growth to grow a single-crystal silicon semiconductor layer 104 (FIG. 1C).

Figure 3A:
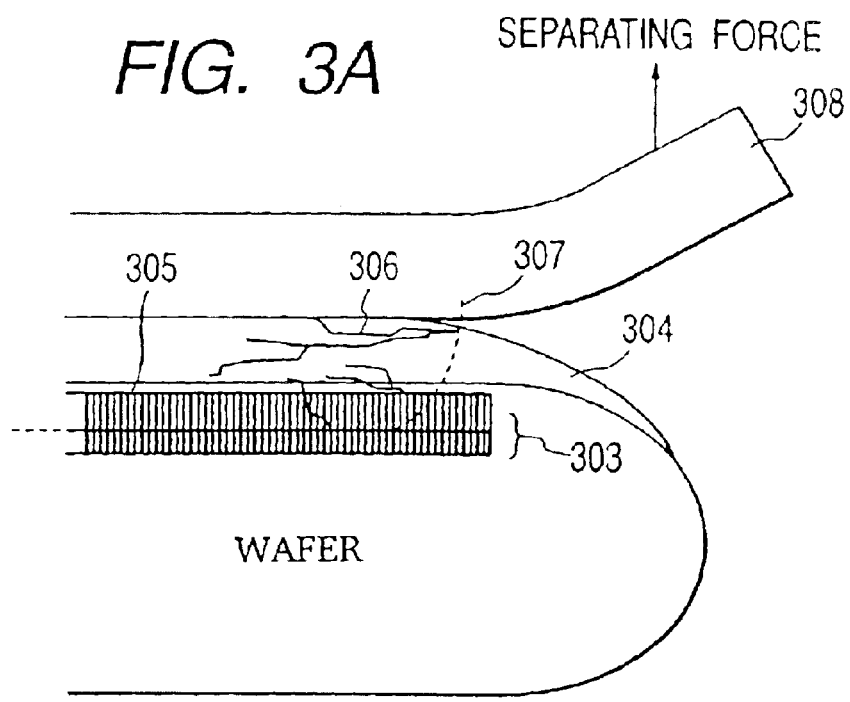
FIGS. 3A and 3B illustrate how an epitaxial layer is cracked or broken when separated.

In the course of the anodizing to make porous, the level of anodizing electric current may be changed, e.g., from a low level to a high level. This makes it possible to previously provide the porous layer with a structural change in density, whereby after epitaxial growth the semiconductor layer 104 can be separated (peeled) from the silicon wafer 101 with ease at the part of the porous layer.

Where the side of a wafer on which the semiconductor layer is formed is defined to be the surface and the other side the back, the semiconductor layer 104 formed on the porous layer 103 comes as follows: When, e.g., the surface portion is made porous in the state the periphery of the surface is shielded from the anodizing solution at the time of anodizing, and the epitaxial growth is carried out on the whole surface, what is formed in and on the wafer are, as shown in FIG. 3A, a porous layer 303, a flat single-crystal layer 305 formed when pores of the porous-layer surface portion are stopped up as a result of the hydrogen annealing carried out before the semiconductor layer is formed, and a single-crystal silicon semiconductor layer 304 formed by epitaxial growth. In order to separate the semiconductor layer to transfer it to a second substrate 308, the semiconductor layer 304, single-crystal layer 305 and porous layer 303 must be broken by separating force so as to reach a portion having the lowest breaking strength in the porous layer, and at this time the semiconductor layer 304 tends to be cracked or broken or to have other defects brought into it. The numeral 307 represents a cutting line.

Figure 3B:
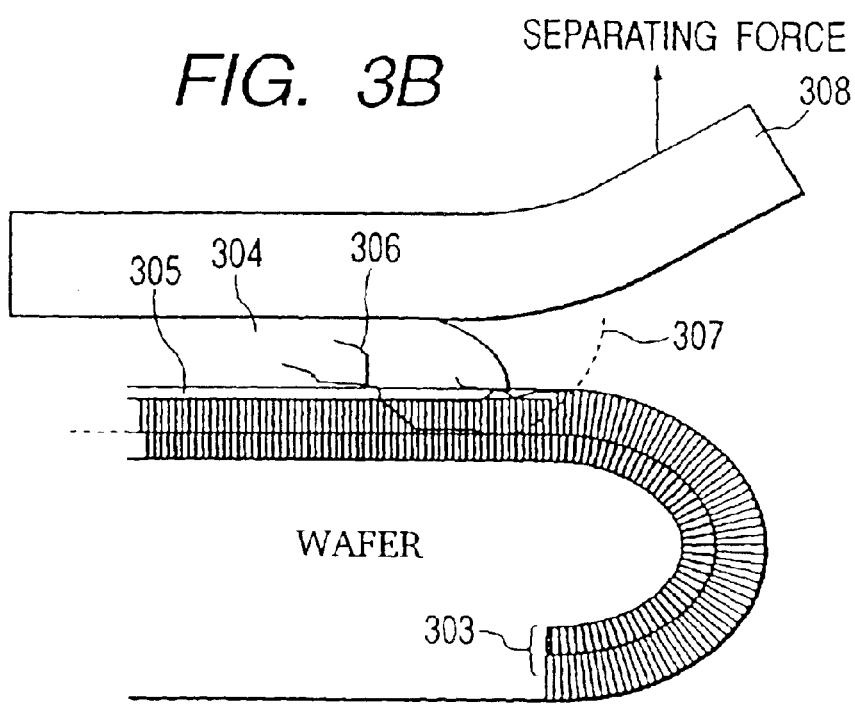

As another example, when the porous layer is formed in the state the back is shielded from the anodizing solution, and the epitaxial growth is carried out in the state the wafer (with the porous layer) is masked on the periphery of the surface up to the whole back, a structure as shown in FIG. 3B comes about. The porous layer 303 is not hydrogen-annealed at its masked portion and hence neither flat single-crystal layer 305 nor semiconductor layer 306 is formed at that portion. In order to separate the semiconductor layer 304 to transfer it to the second substrate 308, the porous layer must be broken at its some portion so that the thin-film single-crystal silicon layer can be separated at a portion having the lowest breaking strength in the porous layer. In this case, too, when the porous layer has a high breaking strength, the single-crystal silicon layer 304 formed by epitaxial growth may be damaged like the above case.

Figure 1D:
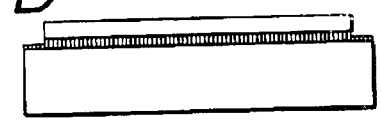
Figure 1H:
Figure 1E:
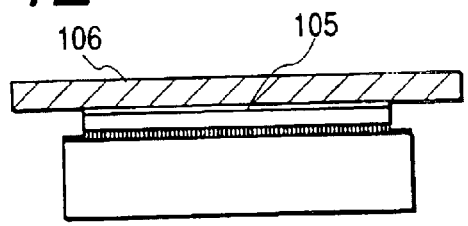
Figure 1F:
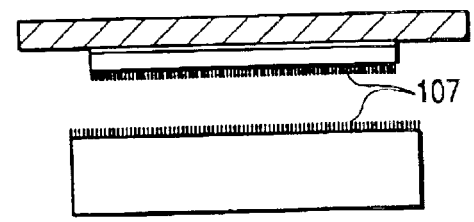

Accordingly, depending on the separation strength of the porous layer, only the single-crystal silicon layer (silicon layer 104) or, in addition thereto, part or the whole of the porous layer at its/their portion(s) lying on the periphery of the separating region is/are removed (FIG. 1D). Then, a second substrate supporting substrate 106 is bonded to the silicon layer 104 via an adhesive layer 105 such that it is not bonded to the portion uncovered after removal (FIG. 1E). Thereafter, a physical separating force (e.g., a direct force such as mechanical force or an indirect force that acts via a medium, such as ultrasonic waves) is applied to the porous layer 103 to separate the silicon layer from the silicon wafer 101 and transfer it onto the supporting substrate 106 (FIG. 1F). In this case, the direct force may directly be applied to the porous layer 103, or may be applied to one or both of the wafer 101 and the supporting substrate 106, or may be applied to all of them.

By doing so, the thin-film semiconductor layer can be made less broken or damaged and also any force applied to the porous layer at its portion other than the part where it is readily separable can be made small, making it possible to effect separation at a small force. Here, the silicon layer and optionally the porous layer may be removed after the supporting substrate 106 has been bonded. In this case, it is efficient to use the supporting substrate as a substitute for a mask necessary for removing the periphery (see FIGS. 2A to 2H). The removing of the semiconductor layer and optionally the porous layer at its/their portion(s) lying on the periphery of the separating region, which may be effective when done at part of the periphery, can be more effective when done on the whole periphery.

Figure 1G:

A porous residue 107 remaining after transfer on the surface of the thin-film single-crystal silicon layer may optionally be etched away by etching or the like to obtain a semiconductor member or solar cell (FIG. 1G). The supporting substrate used for the separation of the silicon layer may be incorporated in the semiconductor member or solar cell product as it is, or the thin-film silicon may again be transferred to a third substrate suited for the product.

The silicon wafer 101 from which the silicon layer has been separated may be treated to remove by etching or the like the porous residue 107 remaining on its surface. Thus, it can be reused in the first step and can effectively be utilized (FIG. 1H).

The removing of the periphery of the separating region, which is to obtain a thin-film semiconductor with ease, may be done before the substrate for supporting the silicon thin film (the supporting substrate) is bonded or before the supporting substrate has been bonded. In the case where the periphery of the separating region is removed before the supporting substrate is bonded, it is removed by dry etching such as reactive ion etching, wet etching or electrolytic etching making use of a hydrofluoric acid type etchant, mechanical methods such as grinding or polishing, or laser-assisted etching, in the state the separating region is masked. Thereafter, the supporting substrate is bonded to the separating region while paying attention so as not to provide the adhesive to the portion uncovered after removal. In the case where the periphery is removed after the supporting substrate has been bonded, the supporting substrate for the thin film may be made to serve as a mask, thereby making good use of the material and saving the step of removing the mask, resulting in a good efficiency.

What is removed is only the peripheral region of the semiconductor layer or, in addition thereto, part or the whole of the peripheral region of the porous layer. Since the porous layer may have a different structure depending on anodizing conditions and may have a different separation strength, it may be removed in a depth most suited for the separation.

Features of the process for producing the semiconductor member and solar cell according to the present invention will be described below in detail.

The porous layer is described first, taking the case of silicon as an example. In the anodizing for forming the porous layer (porous silicon layer) 103, the aqueous HF solution (hydrofluoric acid) may preferably be used. An aqueous hydrogen chloride solution (hydrochloric acid) or a solution of sulfuric acid may also be used. In the case where the aqueous HF solution is used, the $p^+$-type (or $n^+$-type) layer 102 can be made porous when it has an HF concentration of at least 10% by weight. The quantity of electric current flowed at the time of anodizing may appropriately be determined in accordance with the HF concentration, the intended layer thickness of the porous silicon layer and the state of porous layer surface. Stated roughly, it may suitably be within the range of from 1 mA/cm² to 100 mA/cm².

An alcohol such as ethyl alcohol may also be added to the aqueous HF solution, whereby bubbles of reaction product gases generated at the time of anodizing can instantaneously be removed from the reaction liquid surface without stirring and the porous silicon can be formed uniformly and in a good efficiency. The quantity of the alcohol to be added may appropriately be determined in accordance with the HF concentration, the intended layer thickness of the porous silicon layer and the state of porous layer surface. It must be determined especially while paying attention not to make the HF concentration too low.

The single-crystal silicon has a density of 2.33 g/cm³. The density of single-crystal silicon can be changed within the range of from 1.1 to 0.6 g/cm³ by changing the concentration of the aqueous HF solution from 50 to 20% by weight. Also, its porosity can be changed by changing anodizing electric currents, where the porosity increases with an increase in electric currents.

Mechanical strength of porous silicon differs depending on the porosity, and is considered to be sufficiently lower than that of bulk silicon. For example, porous silicon having a porosity of 50% may be estimated to have a mechanical strength of half that of the bulk silicon. Assume that a substrate is bonded to the surface of a porous silicon layer formed at the surface of a silicon wafer and a sufficient bonding power has been given between the porous silicon layer and the substrate. In such a case, the porous silicon layer is broken upon application of an instantaneous separating force such as compression, tension or shear force to the interface between the silicon wafer and the substrate. Also, a like effect is obtainable when an indirect force is made to act between them by externally applying energy such as heat, ultrasonic waves or centrifugal force. Still also, the porous silicon layer can be broken by a weaker force or energy when made to have a higher porosity.

It is reported that, in the formation of porous silicon by anodizing, the anodizing reaction requires holes and hence p-type silicon, in which holes are chiefly present, is used to make the porous silicon (T. Unagami, J. Electrochem. Soc., Vol.127, 476, 1980). On the other hand, however, there is another report that silicon can also be made porous as long as it is a low-resistance n-type silicon (R. P. Holmstrom and J. Y. Chi, Appl. Phys. Lett., Vol.42, 386, 1983). Thus, without regard to whether the silicon is p-type of n-type, it can be made porous using low-resistance silicon. Also, it can be made porous selectively in accordance with its conductivity type, and only the p-type layer can be made porous by carrying out anodizing in the dark as in the FIPOS (full isolation by porous oxidized silicon) process.

In porous silicon obtained by anodizing single-crystal silicon, pores having a diameter of few nanometers are formed as seen in observation with a transmission electron microscope, and the porous silicon has a density half or less that of the single-crystal silicon. Nevertheless, it is kept to stand single-(or mono)crystalline, where an epitaxial layer can be made to grow on the porous silicon by, e.g., thermal CVD.

The porous layer also has voids which are formed in a large quantity in its interior, and hence has come to have a dramatically large surface area compared with its volume. As a result, the rate of its chemical etching can greatly be higher than the etching rate on usual single-crystal layers.

The porous layer is also obtainable similarly by anodizing even when polycrystalline silicon is used in place of single-crystal silicon. On that layer, a single-crystal silicon layer can be formed by, e.g., thermal CVD. (In this case, partial epitaxial growth is possible which corresponds to the size of crystal grains of the polycrystalline silicon.)

To form the thin-film semiconductor layer, liquid-phase epitaxy and gas-phase epitaxy may be used.

(Embodiment 2)

As another embodiment according to the present invention, a semiconductor member production process employing electropolishing is described with reference to FIGS. 10A to 10H.

Figure 10A:
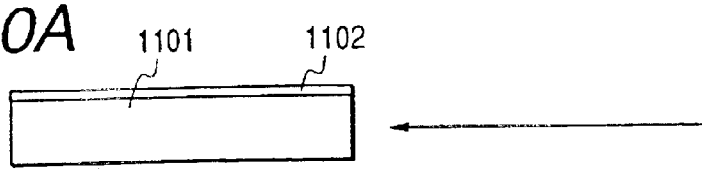
FIGS. 10A, 10B, 10C, 10D, 10E, 10F, 10G and 10H illustrate a semiconductor member production process according to the present invention.
Figure 10B:
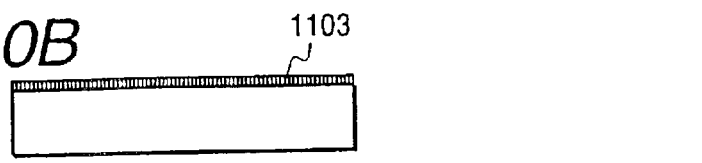

As shown in FIG. 10A, first, into the surface portion (surface layer) of a single-crystal silicon substrate 1101, B (boron) is introduced by thermal diffusion or ion implantation or is incorporated when the substrate (wafer) is produced. The single-crystal silicon substrate the surface layer (1102) of which has become $p^+$-type is subjected to anodizing in, e.g., an aqueous HF solution to make the $p^+$-type surface layer 1102 porous to form a porous layer 1103 (FIG. 10B). Here, the layer may be made porous such that the anodizing is carried out first at a level of low electric current and, after lapse of a certain time, at a level abruptly raised to high electric current and for a short time. This makes it possible to previously provide the porous layer with an internal structural change in density, whereby in a later step a silicon layer 1104 can be separated from the single-crystal silicon substrate 1101 with ease.

Figure 10C:
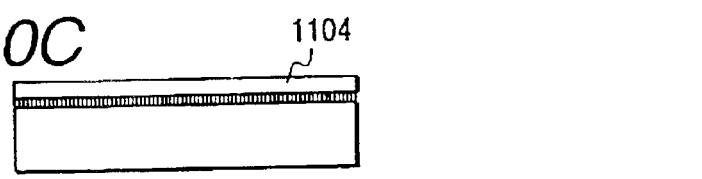

Next, on the surface layer 1103 thus made porous, the silicon layer 1104 is formed by, e.g., thermal CVD (FIG. 10C). Here, at the time the silicon layer 1104 is formed, a dopant may be introduced in a trace quantity to control the silicon layer to be of a $p^-$-type (or $n^-$-type).

Figure 14:
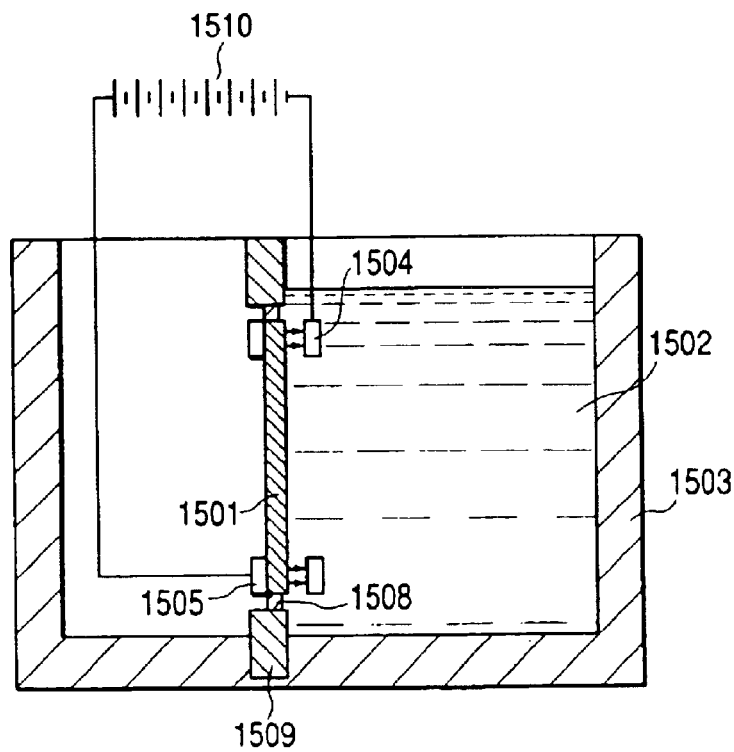
FIG. 14 illustrates the construction of another anodizing apparatus of the present invention.
Figure 16:
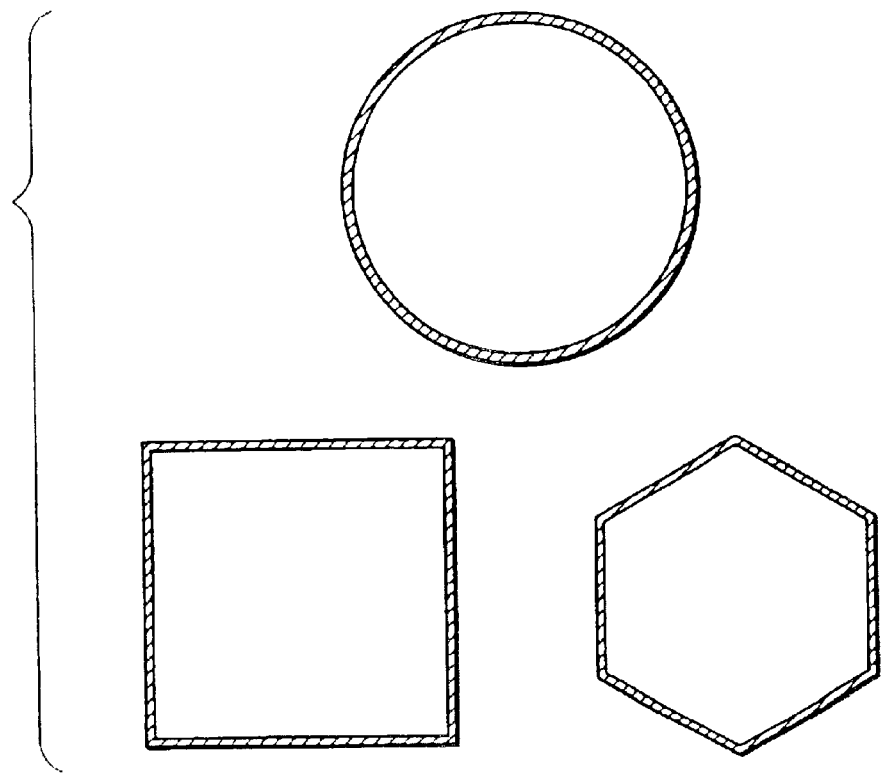
FIG. 16 illustrates examples of a form an electrode for removing the peripheral portion may have, used in the anodizing apparatus of the present invention.

The single-crystal silicon substrate 1101 having the silicon layer 1104 is set in an anodizing apparatus shown in FIG. 14, at its prescribed position such that the silicon layer 1104 faces a negative electrode 1504 in the aqueous HF solution. Here, the negative electrode 1504 has substantially the same form as a positive electrode 1505 coming in contact with the back of the single-crystal silicon substrate 1101, and is provided along the periphery of the single-crystal silicon substrate 1101 in the form of, e.g., a beltlike ring or polygon as shown in FIG. 16. An electric current is flowed across the electrodes and etching is carried out in an electropolishing mode to remove the silicon layer 1104, or the silicon layer 1104 and part or the whole of the porous layer 1103, lying on the periphery of the single-crystal silicon substrate 1101. In this case, the removing of either only the silicon layer 1104 or both the silicon layer 1104 and part or the whole of the porous layer 1103 may be selected in accordance with the separating strength of the porous layer.

With regard to the anodizing apparatus shown in FIG. 14, 1501 is a semiconductor substrate; 1502 is an anodizing solution; 1503 is an anodizing solution bath; 1508 is a seal member; 1509 is a substrate holder; and 1510 is an electrode.

Figure 10D:

In the case where as shown in FIG. 3B the silicon layer 1104 (304) does not completely cover the porous layer 1103 (303) and the porous layer 1103 is uncovered to the surface of the substrate 1101 (wafer), part or the whole of the porous layer 1103 at its uncovered portion is removed (FIG. 10D).

Figure 10H:
Figure 10E:
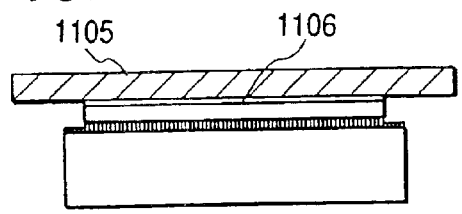

After an oxide film 1106 is formed at the surface of the silicon layer 1104, a supporting substrate 1105 is bonded to the oxide film 1106, and these are put in a heat-treating furnace (not shown) to bring the supporting substrate 1105 and the silicon layer 1104 on the single-crystal silicon substrate 1101 into firm bond (FIG. 10E).

Figure 10F:
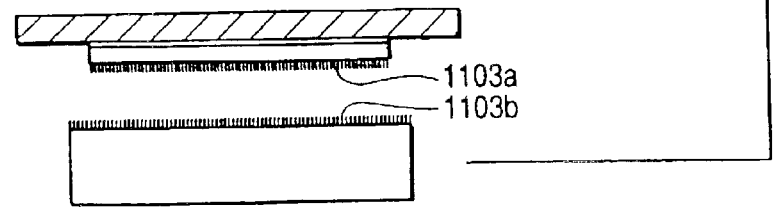

Next, force is made to act between the supporting substrate 1105 and the single-crystal silicon substrate 1101 in the direction where they are pulled apart from each other, to separate them at the part of the porous layer 1103 (FIG. 10F).

Figure 10G:

A porous layer 1103a remaining on the silicon layer 1104 separated from the single-crystal silicon substrate 1101 is selectively removed. Only the porous silicon can be removed by electroless wet chemical etching by the use of at least one of a usual silicon etchant, porous-silicon selective-etchant hydrofluoric acid, a mixed solution prepared by adding at least one of an alcohol and hydrogen peroxide water to hydrofluoric acid, buffered hydrofluoric acid, a mixed solution prepared by adding at least one of an alcohol and hydrogen peroxide water to buffered hydrofluoric acid, and an alkali solution of KOH, NaOH or hydrazine (FIG. 10G). The supporting substrate to which the silicon layer has been transferred may be used as a semiconductor substrate as it is, or, as occasion calls, the silicon layer may again be transferred to a third substrate suited for products.

The single-crystal silicon substrate 1101 after separation may be treated in the same manner as the above to remove a porous layer 1103b remaining on its surface. In a case where the surface is too rough for its flatness to be tolerable, the surface may optionally be flatted (FIG. 10H), and thereafter the substrate is reused in the step of FIG. 10A.

(Embodiment 3)

As still another embodiment according to the present invention, a thin-film crystal solar cell production process employing electropolishing is described with reference to FIGS. 11A to 11I.

Figure 11A:
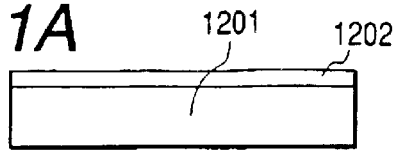
FIGS. 11A, 11B, 11C, 11D, 11E, 11F, 11G, 11H and 11I illustrate a solar cell production process according to the present invention.
Figure 11B:

As shown in FIG. 11A, first, into the surface layer of a single-crystal silicon substrate 1201, B (boron) is introduced by thermal diffusion or ion implantation or is incorporated when the substrate (wafer) is produced. The single-crystal silicon substrate of which the surface layer (1202) has become $p^+$-type is subjected to anodizing in, e.g., an aqueous HF solution to make the $p^+$-type surface layer 1202 porous to form a porous layer 1203 (FIG. 11B). Here, the layer may be made porous such that the anodizing is carried out first at a level of low electric current and, after lapse of a certain time, at a level abruptly raised to high electric current and for a short time. This makes it possible to previously provide the porous layer with an internal structural change in density, whereby in a later step a silicon layer 1204 can be separated from the single-crystal silicon substrate 1201 with ease.

Figure 11C:
Figure 11D:
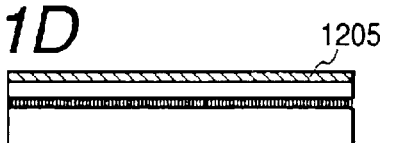

Next, on the surface layer 1203 thus made porous, the silicon layer 1204 is formed by, e.g., thermal CVD (FIG. 11C). Here, at the time the silicon layer 1204 is formed, a dopant may be introduced in a trace quantity to control the silicon layer to be of a $p^-$-type (or $n^-$-type). On the silicon layer 1204, a $p^+$-type layer (or $n^+$-type layer) 1205 is deposited by plasma CVD or by increasing the dopant when the formation of the silicon layer 1204 is finished (FIG. 11D).

The single-crystal silicon substrate 1201 having the silicon layers 1204 and 1205 is set in an anodizing apparatus shown in FIG. 14, at its prescribed position such that the silicon layer 1205 faces a negative electrode 1504 in the aqueous HF solution. Here, the negative electrode 1504 has substantially the same form as a positive electrode 1505 coming in contact with the back of the single-crystal silicon substrate 1201, and is provided along the periphery of the single-crystal silicon substrate 1201 in the form of, e.g., a beltlike ring or polygon as shown in FIG. 16. An electric current is flowed across the electrodes and etching is carried out in an electropolishing mode to remove the silicon layers 1204 and 1205, or the silicon layers 1204 and 1205 and part or the whole of the porous layer 1203, lying on the periphery of the single-crystal silicon substrate 1201. In this case, the removing of either only the silicon layers 1204 and 1205 or both the silicon layers 1204 and 1205 and part or the whole of the porous layer 1203 may be selected in accordance with the separating strength of the porous layer.

Figure 11E:
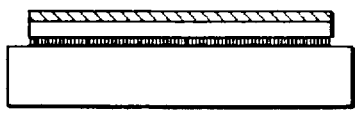

In the case where as shown in FIG. 3B the silicon layers 1204 and 1205 (304) do not completely cover the porous layer 1203 (303) and the porous layer 1203 is uncovered to the surface of the single-crystal silicon substrate 1201 (wafer), part or the whole of the porous layer 1203 at its uncovered portion is removed (FIG. 11E).

Figure 11F:
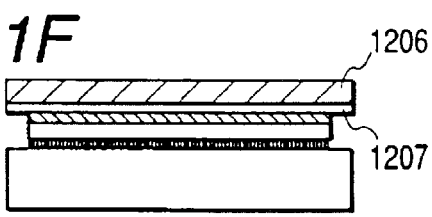

A polymeric-film substrate 1206 on which a silver paste has been printed as a back electrode 1207 is bonded in close contact with the side of the single-crystal silicon substrate 1201 on which the silicon layers 1204 and 1205 have been formed, and these are put in an oven (not shown) and heated to bring the polymeric-film substrate 1206 and the silicon layer 1205 on the single-crystal silicon substrate 1201 into firm bond (FIG. 11F).

Figure 11G:
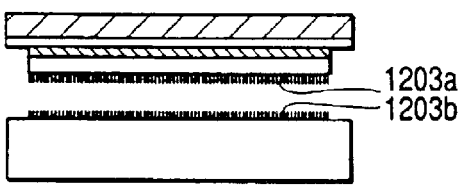

Next, force is made to act between the polymeric-film substrate 1206 and the single-crystal silicon substrate 1201 in the direction where they are pulled apart from each other. That is, the flexibility of the polymeric film is utilized and the both are slowly drawn off from an edge of the single-crystal silicon substrate 1201 to separate them at the part of the porous layer 1203 (FIG. 11G).

A porous layer 1203a remaining on the silicon layer 1204 separated from the single-crystal silicon substrate 1201 is selectively removed. Only the porous silicon is removed by electroless wet chemical etching by the use of at least one of a usual silicon etchant, porous-silicon selective-etchant hydrofluoric acid, a mixed solution prepared by adding at least one of an alcohol and hydrogen peroxide water to hydrofluoric acid, buffered hydrofluoric acid, a mixed solution prepared by adding at least one of an alcohol and hydrogen peroxide water to buffered hydrofluoric acid, and an alkali solution of KOH, NaOH or hydrazine.

Figure 11H:
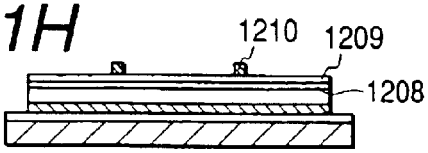

On the surface of the silicon layer 1204 from which the porous layer has been removed, an n$^+$-type (or p$^+$-type) layer 1208 is formed and further thereon a transparent conductive film (ITO) serving also as a surface anti-reflection layer and a grid type collector electrode 1210 are formed by vacuum deposition to make up a solar cell (FIG. 11H).

The single-crystal silicon substrate 1201 after separation may be treated in the same manner as the above to remove a porous layer 1203b remaining on its surface. In a case where the surface is too rough for its flatness to be tolerable, the surface may optionally be flatted (FIG. 11I), and thereafter the substrate is reused in the step of FIG. 11A.

(Embodiment 4)

As a further embodiment according to the present invention, a thin-film crystal solar cell production process employing electropolishing is described with reference to FIGS. 12A to 12I.

Figure 12A:
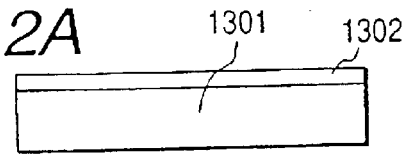
FIGS. 12A, 12B, 12C, 12D, 12E, 12F, 12G, 12H and 12I illustrate another solar cell production process according to the present invention.
Figure 12B:

As shown in FIG. 12A, first, into the surface layer of a single-crystal silicon substrate 1301, B (boron) is introduced by thermal diffusion or ion implantation or is incorporated when the substrate (wafer) is produced. The single-crystal silicon substrate the surface layer (1302) of which has become p$^+$-type is subjected to anodizing in, e.g., an aqueous HF solution to make the p$^+$-type surface layer 1302 porous to form a porous layer 1303 (FIG. 12B). Here, the layer may be made porous such that the anodizing is carried out first at a level of low electric current and, after lapse of a certain time, at a level abruptly raised to high electric current and for a short time. This makes it possible to previously provide the porous layer with an internal structural change in density, whereby in a later step a silicon layer 1304 can be separated from the single-crystal silicon substrate 1301 with ease.

Figure 12C:
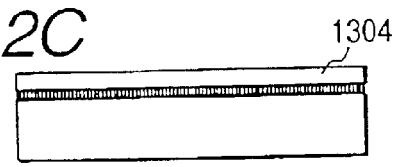

Next, on the surface layer 1303 thus made porous, the silicon layer 1304 is formed by, e.g., thermal CVD (FIG. 12C). Here, at the time the silicon layer 1304 is formed, a dopant may be introduced in a trace quantity to control the silicon layer to be of a p$^-$-type (or n$^-$-type). On the silicon layer 1304, an n$^+$-type layer (or p$^+$-type layer) 1305 is deposited by plasma CVD or by increasing the dopant when the formation of the silicon layer 1304 (FIG. 12D) is finished.

Figure 15:
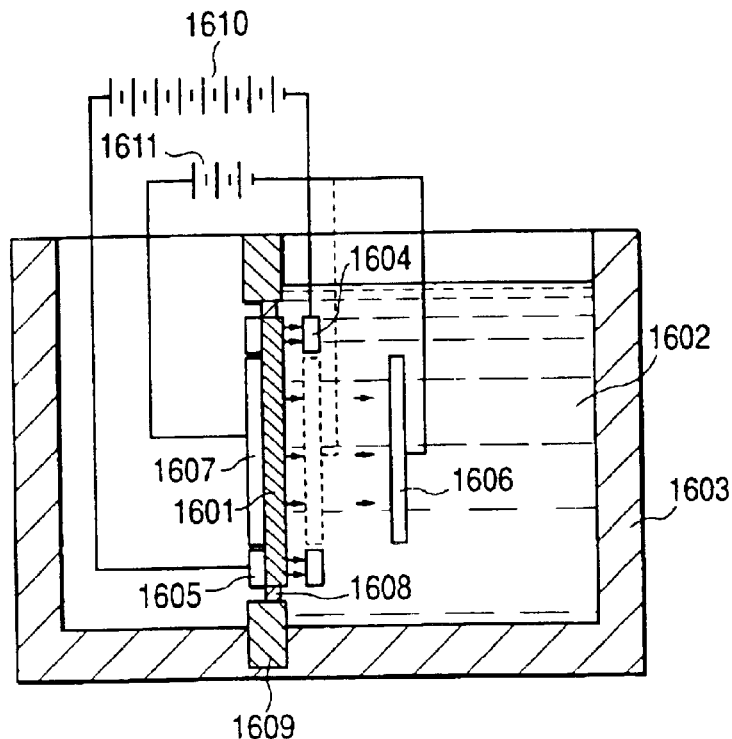
FIG. 15 illustrates the construction of still another anodizing apparatus of the present invention.
Figure 17:
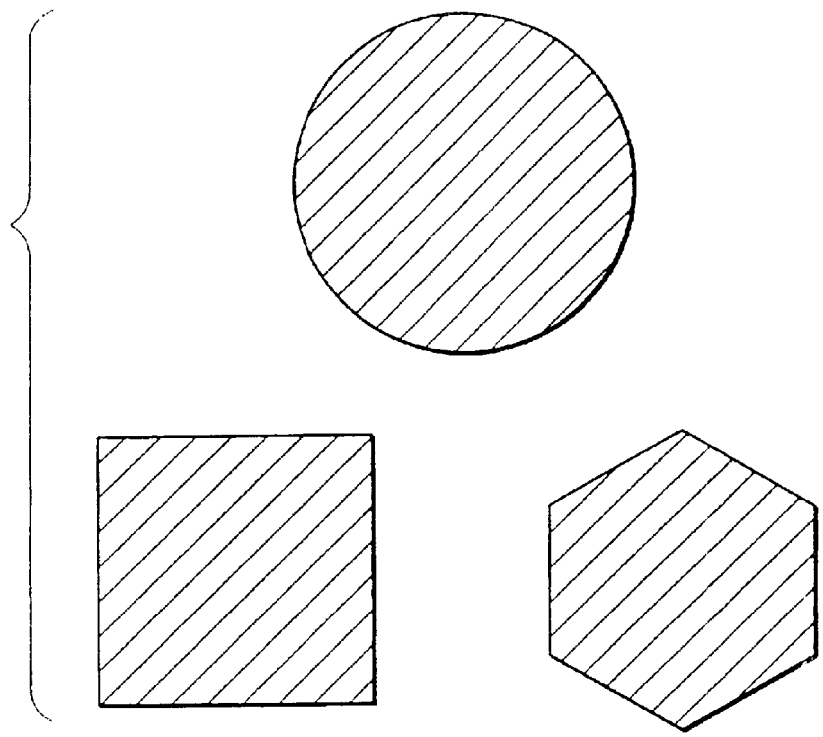
FIG. 17 illustrates other examples of a form an electrode for removing the peripheral portion may have, used in the anodizing apparatus of the present invention.

The single-crystal silicon substrate 1301 having the silicon layers 1304 and 1305 is set in an anodizing apparatus shown in FIG. 15, at its prescribed position such that the silicon layer 1305 faces negative electrodes 1604 and 1606 in the aqueous HF solution. Here, the negative electrodes 1604 and 1606 have substantially the same form as positive electrodes 1605 and 1607, respectively, coming in contact with the back of the single-crystal silicon substrate 1301. The electrodes 1604 and 1605 are provided along the periphery of the single-crystal silicon substrate 1301 in the form of, e.g., a beltlike ring or polygon as shown in FIG. 16. The electrodes 1606 and 1607 are positioned inside the electrodes 1604 and 1605, respectively, in the region other than the periphery of the single-crystal silicon substrate 1301 and in the form of, e.g., a disk or polygon as shown in FIG. 17.

In more detail, 1601 is a semiconductor substrate; 1602 is an anodizing solution; 1603 is an anodizing solution bath; 1608 is a seal member; 1609 is a substrate holder; and 1610 and 1611 are electrodes.

A relatively high electric current is flowed across the electrodes 1604 and 1605 and etching is carried out in an electropolishing mode to remove the silicon layers 1304 and 1305, or the silicon layers 1304 and 1305 and part or the whole of the porous layer 1303, lying on the periphery of the single-crystal silicon substrate 1301. In this case, the removing of either only the silicon layers 1304 and 1305 or both the silicon layers 1304 and 1305 and part or the whole of the porous layer 1303 may be selected in accordance with the separating strength of the porous layer.

In the case where as shown in FIG. 3B the silicon layers 1304 and 1305 (304) do not completely cover the porous layer 1303 (303) and the porous layer 1303 is uncovered to the surface of the single-crystal silicon substrate 1301 (wafer), part or the whole of the porous layer 1303 at its uncovered portion is removed. A relatively low electric current is flowed across the electrodes 1604 and 1605 to carry out conventional anodizing, and a thin porous layer 1309 is formed on the surface of the silicon layer 1304 in its region other than the peripheral region of the single-crystal silicon substrate 1301 to provide an anti-reflection layer (FIG. 12E). Here, the step of removing the silicon layer and porous layer on the periphery and the step of forming the porous layer on the surface of the silicon layer in its region other than the peripheral region may be carried out simultaneously or separately.

Figure 12D:
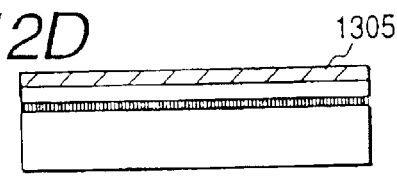
Figure 12I:
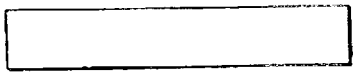
Figure 12E:
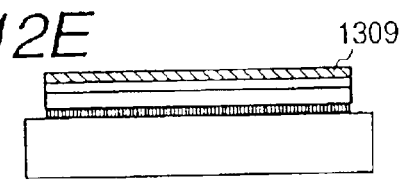
Figure 12F:
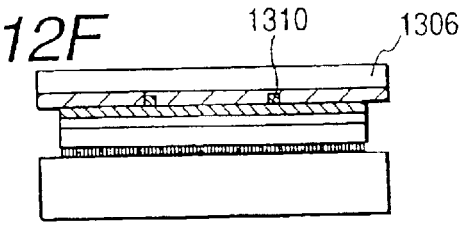

After a grid electrode 1310 is formed on the surface of the porous layer 1309, a transparent polymeric-film substrate 1306 is bonded with an adhesive to the side of the single-crystal silicon substrate 1301 on which the silicon layers 1304 and 1305 have been formed, and these are put in an oven (not shown) and heated to bring the polymeric-film substrate 1306 and the silicon layer 1305 on the single-crystal silicon substrate 1301 into firm bond (FIG. 12F).

Figure 12G:
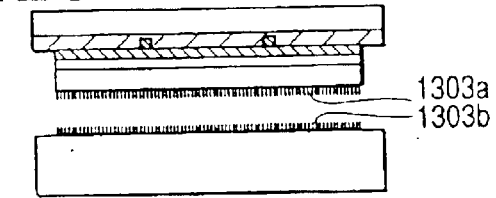

Next, the transparent polymeric-film substrate 1306 and the single-crystal silicon substrate 1301 with the stated layers, thus firmly bonded, are put in a water bath to make ultrasonic waves act thereon (not shown). Thus, the silicon layer 1304 is separated from the single-crystal silicon substrate 1301 at the part of the porous layer 1303 (FIG. 12G).

A porous layer 1303a remaining on the silicon layer 1304 separated from the single-crystal silicon substrate 1301 is selectively removed. Only the porous silicon is removed by electroless wet chemical etching by the use of at least one of a usual silicon etchant, porous-silicon selective-etchant hydrofluoric acid, a mixed solution prepared by adding at least one of an alcohol and hydrogen peroxide water to hydrofluoric acid, buffered hydrofluoric acid, a mixed solution prepared by adding at least one of an alcohol and hydrogen peroxide water to buffered hydrofluoric acid, and an alkali solution of KOH, NaOH or hydrazine.

Figure 12H:
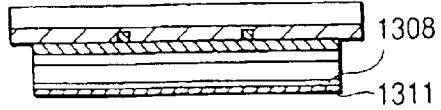

On the back of the silicon layer 1304 from which the porous layer has been removed, a p$^+$-type (or n$^+$-type) layer 1308 is formed and a back electrode 1311 is formed by vacuum deposition to make up a solar cell (FIG. 12H). Here, in contact with the back electrode 1311, another supporting substrate (metal substrate) may optionally be bonded via a conductive adhesive.

The single-crystal silicon substrate 1301 after separation may be treated in the same manner as the above to remove a porous layer 1303b remaining on its surface. In a case where the surface is too rough for its flatness to be tolerable, the surface may optionally be flatted (FIG. 12I), and thereafter the substrate is reused in the step of FIG. 12A.

As described above, according to the present invention, after the thin-film semiconductor layer has been formed on the porous layer, the thin-film semiconductor layer and optionally the porous layer lying on the periphery of the separating region are kept removed before the former is bonded to the supporting substrate to which it is to be transferred. This enables the separating force to act in a good efficiency at the portion readily separable in the porous layer (inclusive of the interface between it and the substrate or semiconductor layer), and hence enables separation free of any adverse effect such as cracking or breaking of the thin-film semiconductor layer. Thus, thin-film semiconductor members having good characteristics can be obtained in a good efficiency.

In addition, according to the present invention, while after the thin-film semiconductor layer has been formed on the porous layer the thin-film semiconductor layer and optionally the porous layer lying on the periphery of the separating region are kept removed before the former is bonded to the supporting substrate to which it is to be transferred, the anti-reflection layer is kept formed on the surface of the semiconductor layer in the separating region. This enables separation of the thin-film semiconductor layer having the anti-reflection layer formed beforehand, without causing any cracks or breaks on the periphery. Thus, thin-film semiconductor members having good characteristics can be obtained through a process with simplified steps.

In the anodizing for forming the porous layer which serves as a separating layer or peeling layer used in the present invention, the aqueous HF solution is used, where layer can be made porous when it has an HF concentration of at least 10% by weight. The quantity of electric current flowed at the time of anodizing may appropriately be determined in accordance with the HF concentration, the intended layer thickness of the porous silicon layer and the state of porous layer surface. Stated roughly, it may suitably be within the range of from 1 mA/cm$^2$ to 100 mA/cm$^2$. In the course of the anodizing, the level of anodizing electric current may be changed. This makes it possible to previously provide the porous layer with a structural change in density. Thus, its porous structure can be made plural into two or more layers to enable easy separation.

With the addition of the alcohol such as ethyl alcohol to the aqueous HF solution, bubbles of reaction product gases generated at the time of anodizing can instantaneously be removed from the reaction liquid surface without stirring and the porous silicon can be formed uniformly and in a good efficiency. The quantity of the alcohol to be added may appropriately be determined in accordance with the HF concentration, the intended layer thickness of the porous silicon layer and the state of porous layer surface. It must be determined especially while paying attention not to make the HF concentration too low.

Figure 18:
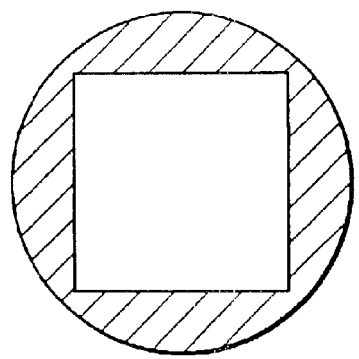
FIG. 18 illustrates another example of a form an electrode for removing the peripheral portion may have, used in the anodizing apparatus of the present invention.
Figure 19:
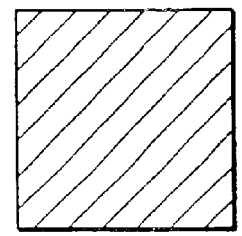
FIG. 19 illustrates still another example of a form an electrode for forming an anti-reflection layer may have, used in the anodizing apparatus of the present invention.

In the anodizing apparatus used in the present invention to etch the semiconductor layer at its peripheral portion or to form the anti-reflection layer at the surface of the semiconductor layer in its region other than the periphery, the electric currents applied across the electrodes for removing the peripheral portion and across the electrodes for forming the anti-reflection layer may preferably independently be controlled. As the form of the electrodes, those having forms as shown in FIGS. 16 and 17 may preferably be used which are fitted to the form the substrate to be treated has, and the electrodes for forming the anti-reflection layer may preferably be so disposed as to be inside the electrodes for removing the peripheral portion. Also, as occasion calls, a form in which the middle area of a disk has been hollowed out in square as shown in FIG. 18 and a form corresponding substantially to the hollowed-out square as shown in FIG. 19 may be employed in the electrodes for removing the peripheral portion and the electrodes for forming the anti-reflection layer, respectively. Using electrodes having such forms, a semiconductor layer having a square form can be separated from a substrate having the form of a round wafer. As materials for the electrodes, there are no prescriptions on those for the anode side, but those endurable to acids such as hydrofluoric acid are preferred for those on the cathode side, and platinum may most preferably be used.

Figure 13:
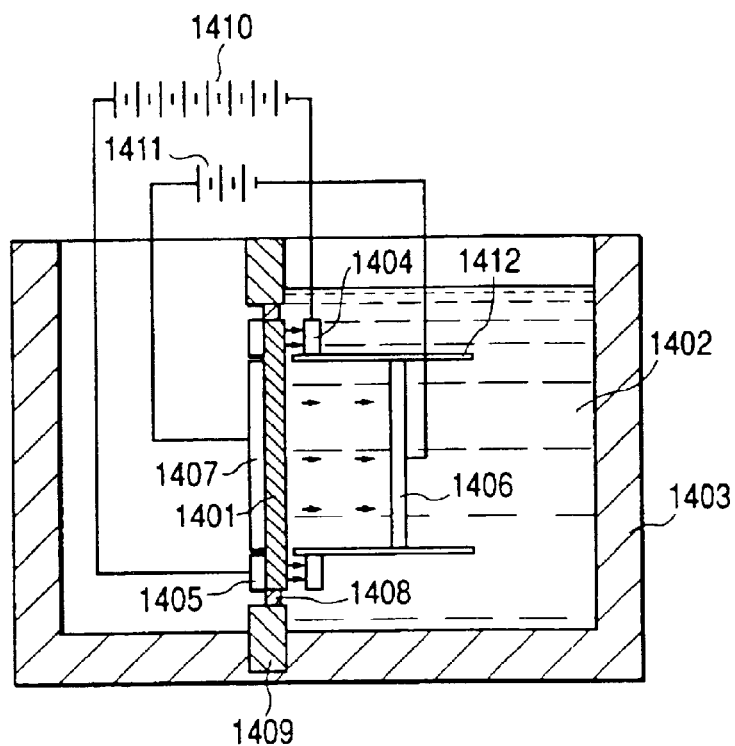
FIG. 13 illustrates the construction of an anodizing apparatus of the present invention.

An anodizing apparatus having an isolator 1412 (having a cross-sectional form corresponding to the form of the electrodes for forming the anti-reflection layer) as shown in FIG. 13 may also be used for the purpose of improving the independency of electric current control between the electrodes for removing the peripheral portion and between the electrodes for forming the anti-reflection layer.

In more detail, 1401 is a semiconductor substrate; 1402 is an anodizing solution; 1403 is an anodizing solution bath; 1404 is an electrode for removing a peripheral portion (a cathode); 1405 is an electrode for removing a peripheral portion (an anode); 1406 is an electrode for forming an anti-reflection layer (a cathode); 1407 is an electrode for forming an anti-reflection layer (an anode); 1408 is a seal member; 1409 is a substrate holder; and 1410 and 1411 are electrodes.

There are no particular prescriptions on the distance between the substrate to be treated and the electrode on the cathode side. With regard to the electrodes for removing the peripheral portion, since a relatively high electric current is flowed thereto, it is preferred that the cathode-side electrode is disposed at a position close to the substrate as far as possible in order to make a loss occur less and the distance between the electrodes is shorter than that between the electrodes for forming the anti-reflection layer. With regard to the electrodes for forming the anti-reflection layer, the electrode on the cathode side may be at any desired distance to the substrate (see FIGS. 13 to 15).

As conditions for providing the electropolishing mode to etch the semiconductor layer and optionally the porous layer at their peripheral portions, the etching can be effected at an HF concentration of at least 20% by weight when silicon is etched with the aqueous HF solution. To dilute hydrogen fluoride (HF), electroconductivity-providing agents including alcohols such as ethyl alcohol, water, acids or salts thereof may be used. The quantity of electric current flowed here may appropriately be determined in accordance with the HF concentration. Stated roughly, it may suitably be within the range of from 10 mA/cm$^2$ to 100 mA/cm$^2$.

The crystal growth process used in the present invention to form the silicon layer on the porous layer may include thermal CVD, LPCVD (low-pressure CVD), sputtering, plasma CVD, photo-assisted CVD, and liquid-phase epitaxy. As material gases used in the case of, e.g., gas-phase epitaxy such as the thermal CVD, LPCVD, plasma CVD or photo-assisted CVD, they may typically include silanes such as $SiH_2Cl_2$, $SiCl_4$, $SiHCl_3$, $SiH_4$, $Si_2H_6$, $SiH_2F_2$ and $Si_2F_6$, and halogenated silanes.

In addition to the above material gases, hydrogen ($H_2$) is added as a carrier gas or for the purpose of providing a reducing atmosphere to accelerate crystal growth. The proportion of the material gases and hydrogen may appropriately be determined in accordance with the methods of formation, the types of material gases and also the conditions for formation. It may suitably be from 1:10 to 1:1,000 (feed flow rate ratio), and more preferably from 1:20 to 1:800.

In the case where the liquid-phase epitaxy is used, silicon is dissolved in a solvent such as Ga, In, Sb, Bi or Sn to effect epitaxial growth while cooling the solvent gradually or providing a temperature difference in the solvent.

As for temperature and pressure in the epitaxial growth process used in the present invention, they may differ depending on the methods of formation and the types of materials (gases) used. With regard to the temperature, it may suitably be from 800° C. to 1,250° C. in approximation when silicon is grown by usual thermal CVD, and may more preferably be controlled to from 850° C. to 1,200° C. In the case of the liquid-phase epitaxy, the temperature depends on the types of the solvent, and may preferably be controlled to from 600° C. to 1,050° C. when silicon is grown using Sn or In as the solvent. In low-temperature processes such as plasma CVD, it may suitably be from 200° C. to 600° C. in approximation, and may more preferably be controlled to from 200° C. to 500° C.

Similarly, with regard to the pressure, it may suitably be from $10^{-2}$ Torr to 760 Torr in approximation, and more preferably be within the range of from $10^{-1}$ Torr to 760 Torr.

The substrate to which the thin-film crystal semiconductor layer is transferred in the process of the present invention may be any of those having a rigidity and those having a plasticity. For example, it may include silicon wafers, SUS stainless steel sheets, glass sheets, and plastic or resin films. As resin film materials, polymeric films may preferably be used, including as typical ones polyimide film, EVA (ethylene vinyl acetate) film, and Tefzel.

As methods for bonding the substrate to the thin-film crystal semiconductor layer in the present invention, a method may preferably be used in which a conductive metal paste such as copper paste or silver paste, a mixture of such a conductive metal paste with glass frit, or an epoxy type adhesive is inserted between the both to bring them into adhesion, followed by burning to effect firm bond. In this case, the metal such as copper or silver sintered by burning functions also as a back electrode and a back reflection layer. Also, in the case of the substrates such as polymeric films, the substrate and the thin-film crystal semiconductor layer are brought into adhesion and in this state (here, a back electrode is previously formed on the surface of the thin-film crystal semiconductor layer) the temperature is raised to the softening point of the film substrate to bond the both firmly.

Methods for separating the semiconductor layer whose peripheral portion has been removed include a method in which a mechanical external force is made to act directly between the substrates to make separation at the part of the porous layer as a separating layer, and a method in which force (internal stress) existing in the semiconductor layer and separating layer, or between these and the substrate, or energy such as heat, ultrasonic waves, electromagnetic waves or centrifugal force applied externally is utilized and made to act indirectly on a brittle portion in the separating layer.

In the solar cell according to the present invention, the surface of the semiconductor layer may be subjected to texture treatment in order to make incident light reflect less. In the case of silicon, the treatment is made using hydrazine, NaOH or KOH. The height of pyramids of the texture formed may suitably be within the range of from several microns to tens of microns.

EXAMPLES

The present invention will be described below in greater detail by giving Examples specifically.

Example 1

The present Example concerns production of a thin-film solar cell according to the process shown in FIGS. 1A to 1H.

Into the surface layer of one side of a p-type single-crystal silicon substrate (wafer) 101 of 800 μm thick and 4 inches diameter, B (boron) was introduced by thermal diffusion to form a $p^+$-type layer 102. This substrate was subjected to anodizing in the state its side on which the $p^+$-type layer was not formed was shielded from an anodizing solution and while changing electric currents into two stages, to obtain a porous layer 103 of about 13 μm thick. The electric currents were first flowed at 8 mA/cm² for 10 minutes and thereafter flowed at 30 mA/cm² for 1 minute. Because of the changing of electric currents, the porous layer was formed in double-layer structure consisting of a porous layer with a dense structure and a porous layer with a coarse structure.

Next, the p-type single-crystal silicon wafer 101 at the surface of which the porous layer 103 was formed was annealed at a surface temperature of 1,050° C. for 1 minute in an atmosphere of hydrogen, and was thereafter immersed in a 900° C. metallic solution of indium into which silicon had been dissolved to become supersaturated, followed by slow cooling to form the silicon layer 104 in a thickness of 30 μm. Here, a cover was provided on the porous layer such that the silicon layer 104 was formed only in the region of a concentric circle smaller by 7 mm in diameter than the wafer.

Next, to the surface of the silicon layer 104, P (phosphorus) was diffused to form an $n^+$-type layer, and thereafter nine solar-cell regions each having an area of 1 cm² were fabricated at the central portion of the silicon layer 104 by isolation of the $n^+$-type layer, and an electrode and an anti-reflection layer were further formed. The silicon substrate 101 with these was set in a chamber of a reactive ion etching apparatus, and a glass protective mask of 90 mm diameter was placed thereon in center alignment with the wafer. The portion protruded from the glass mask was etched on the surface side of the silicon layer to remove the silicon layer and part of the porous layer at that portion. These were removed in a depth of about 11 μm, which reached the second-layer porous layer by about a half of its layer thickness. A transparent adhesive 105 was coated on the surface of the remaining silicon layer 104 such that it was not forced out to the portion uncovered after removal as well as the side (lateral surface) uncovered after removal, and then a transparent substrate 106 was firmly bonded thereto. Thereafter, force was made to act on the porous layer to separate the silicon layer 104 from the silicon substrate 101, and a back electrode was formed to make up a solar cell.

Compared with a solar cell produced by separating the silicon layer 104 without removing the peripheral portion of the separating region of the silicon substrate 101, solar cells were obtainable in a good yield because the silicon layer was less cracked or broken, and also high values were obtainable on their photoelectric conversion efficiency.

Example 2

The present Example concerns production of a semiconductor member according to the process shown in FIGS. 2A to 2H.

Figure 2A:
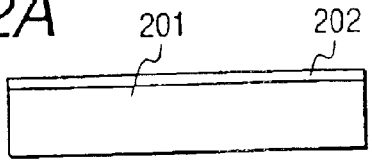
FIGS. 2A, 2B, 2C, 2D, 2E, 2F, 2G and 2H illustrate another example of a thin-film semiconductor production process according to the present invention, which is a process carried out in Example 2.
Figure 2B:
Figure 2C:
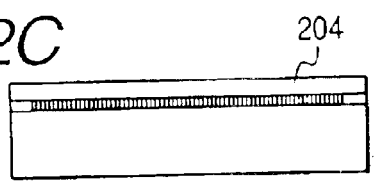

A porous layer 203 of about 13 μm thick was formed in the same manner as in Example 1 except that a $p^+$-type layer 202 was formed at the surface of a p-type silicon substrate (wafer) 201 of 5 inches diameter and the wafer was shielded from the anodizing solution on its periphery 5 mm inward the semiconductor growth surface from the peripheral edge of the wafer. Thereafter, a silicon semiconductor layer 204 of 0.5 μm thick was epitaxially grown by CVD. (FIGS. 2A to 2C).

Figure 2D:
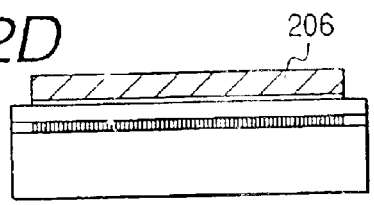
Figure 2H:
Figure 2E:
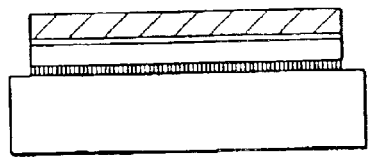
Figure 2F:
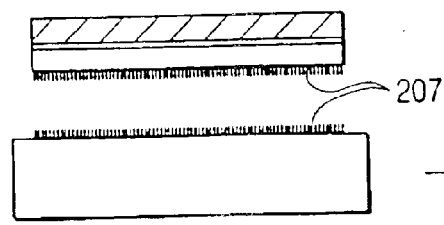
Figure 2G:
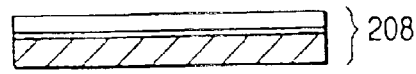

Next, the surface layer of the semiconductor layer 204 was subjected to thermal oxidation to form an $SiO_2$ layer, and thereafter a same-type quartz glass substrate 206 having a diameter smaller by 15 mm than the silicon substrate 201 was bonded thereto in its center alignment with the wafer under heat treatment at 700° C. for 0.5 hours (FIG. 2D). Then the portion protruded from the glass substrate 206 (i.e., part of the semiconductor layer 204, part of the porous layer 203 and the semiconductor layer 202) was removed by reactive ion etching (FIG. 2E). It was removed in a depth of about 23 μm from the surface on the side of the substrate. The glass substrate 206 was irradiated with ultrasonic waves to break the porous layer 203 to effect separation, so that the thin-film semiconductor layer was transferred onto the glass substrate 206. Also, a porous residue 207 remaining on the surface of the semiconductor layer 204 was removed by etching to obtain an SOI (silicon-on-insulator) member 208.

In visual examination, neither cracks nor breaks were observable at the peripheral portion of the semiconductor layer. As a result of further observation with a transmission electron microscope, it was confirmed that any additional defects were not seen to have been brought into the layer and a good crystal state was obtained.

Example 3

On both sides of a polycrystalline silicon wafer 501 (FIG. 5) of 1 mm thick and 4 inches diameter, $p^+$-type layers were formed and thereafter this wafer was subjected to anodizing on its both sides in the state the wafer was shielded from an anodizing solution in the same manner as in Example 2. Electric currents were first flowed at 8 mA/cm$^2$ for 10 minutes and thereafter flowed at 32 mA/cm$^2$ for 1 minute. Since the values of electric currents were set under conditions different form those in Example 1, porous layers were formed in a lower strength. The porous layers formed in double-layer structure on both sides of the wafer were each in a layer thickness of about 12 μm.

Figure 4:
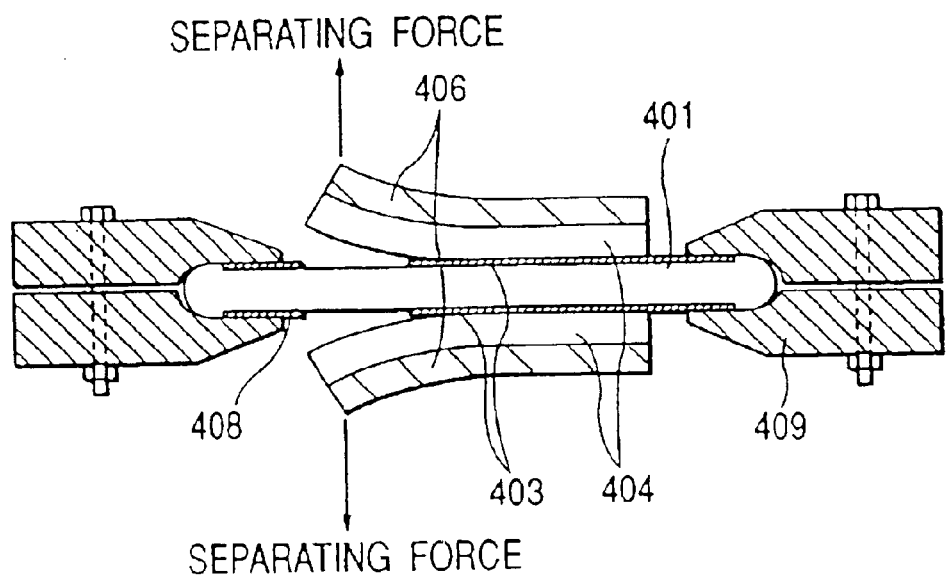
FIG. 4 is a cross-sectional view of a separating jig used in Example 3.
Figure 5:
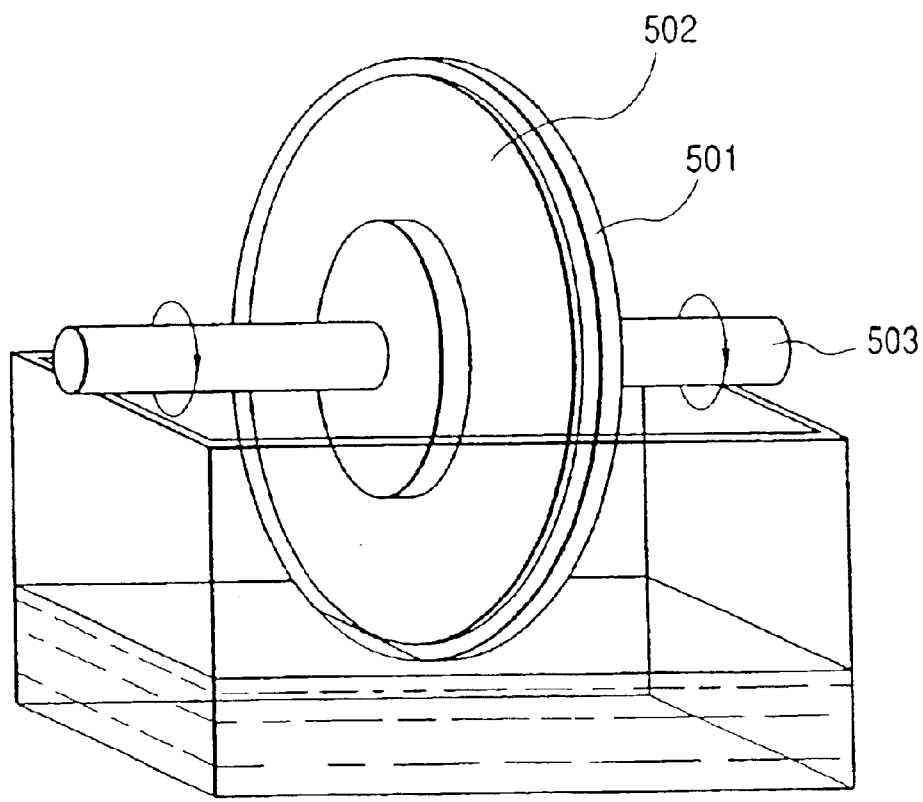
FIG. 5 is a schematic view of a holder portion of a periphery etching apparatus used in Example 3.

Subsequently, on each porous layer on the both sides of the wafer, an $n^+$-type semiconductor layer of about 0.2 μm thick and a $p^+$-type semiconductor layer of 30 μm were successively epitaxially grown by immersing the wafer with porous layer in liquid-phase epitaxy solutions in which impurities suited respectively to these layers had been dissolved. Aluminum substrates 502 (406 in FIG. 4) serving also as back electrodes and supporting substrates, having a size smaller by 7 mm in radius than the wafer, were thermally fused to the semiconductor layers on the both sides and simultaneously aluminum was diffused to form $p^+$-type layers. Thereafter, each aluminum substrate 502 was protected by masking with a material resistant to hydrofluoric acid, and the uncovered portions of the semiconductor layers were removed by etching with a hydrofluoric acid/nitric acid (HF:HNO=3:1) etchant 505. The etching was carried out using a jig as shown in FIG. 5. A holder 503 is joined to wafer holders (not shown) so that the wafer can be held between them. The main body of the jig also has the function to enable adjustment of height so that only the portion intended to be etched is immersed in the etchant. After the semiconductor layers on the both sides at their peripheral portions were removed by etching, the masking of the aluminum substrates was removed. Then, as shown in FIG. 4, force was applied to the porous layers 403 while holding with the jig 409 the regions 408 in wafer 401 from which the semiconductor layers 404 were removed, thus the semiconductor layers 404 on the both sides were separated. As a result, the semiconductor layers 404 were respectively transferred to aluminum substrates 406. Porous residues having remained on the surfaces of the semiconductor layers were removed, followed by isolation, where four cells each having an area of 4 cm$^2$ were fabricated, grid electrodes were formed and TiO$_2$ anti-reflection layers having also the passivation effect were deposited to make up solar cells.

Compared with solar cells having the same construction but produced by separating the semiconductor layers without removing their peripheral portions, those produced by separating the semiconductor layers after the removing of their peripheral portions less caused the defects such as cracks or breaks by separation, and hence the yield of cells was good and also high values were obtainable on their conversion efficiency.

Porous residues having remained on the wafer surfaces after the liquid-phase epitaxial thin films were separated were also removed, and the wafer was again subjected to the like steps. As a result, solar cells having a high conversion efficiency were obtainable without any problem.

Example 4

Figure 6:
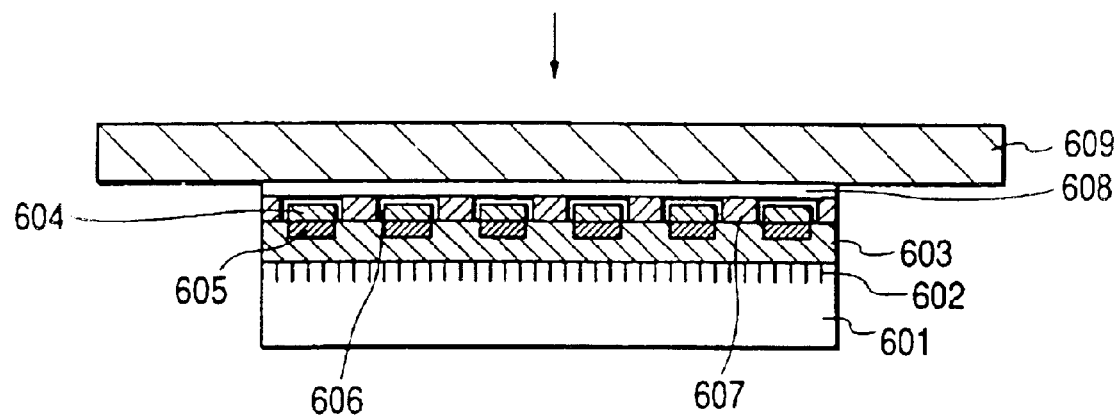
FIG. 6 is a cross-sectional view of a back-side junction-concentrated solar cell formed in Example 4.

One side of a single-crystal silicon wafer 601 (FIG. 6) of 1 mm thick and 5 inches diameter was subjected to anodizing under the same conditions as in Example 3 to form a porous layer 602 of 12 μm thick in double-layer structure. The same wafer as the above on one side of which a porous layer was formed in the same way was additionally prepared. These two wafers were closely put together face to face on their side opposite to the side on which the porous layer was formed, and their periphery was covered and fixed with a jig such that any liquid-phase epitaxy solution did not enter their side on which the porous layer was not formed. These were immersed in a liquid-phase epitaxy solution to grow a $p^-$-type semiconductor layer 603 epitaxially in a thickness of about 40 μm on each porous layer.

Next, the wafers with these layers were detached from the jig. On each semiconductor layer and in its region of 75 mm×75 mm, a comb-like pattern 604 with fingers of 80 μm wide and 100 μm in pitch which extended form a bus bar of 3 mm wide was formed by screen printing using a paste containing aluminum. Then, the aluminum-silicon contact surface and its vicinity was made into alloy at 900° C. to form a $p^+$-type layer 605 and simultaneously the whole surface was oxidized. Only the part where silicon surface was oxidized was selectively removed by etching without removing oxide film 606 of aluminum. Thereafter, an $n^+$-type semiconductor layer 607 was deposited on the surface by CVD.

Figure 7:
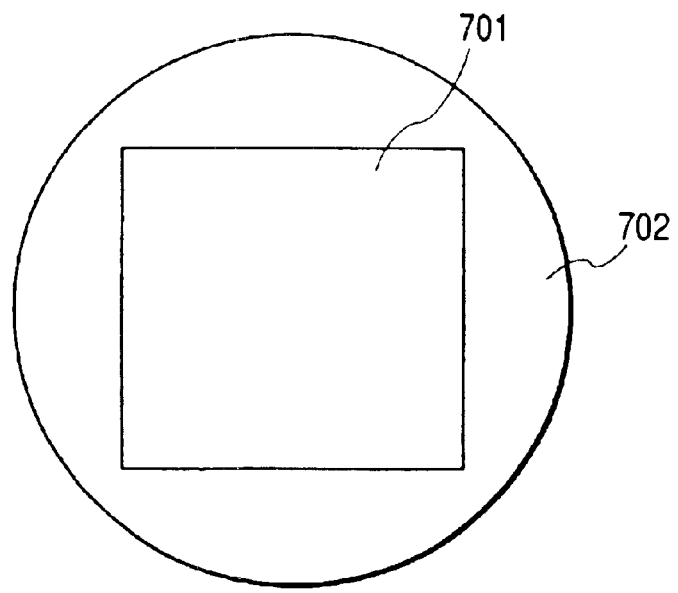
FIG. 7 is a plan view showing a periphery-removing portion of the solar cell formed in Example 4.

Next, the region where the pattern of $p^+$-type layer 605 and $n^+$-type layer 607 was formed was bonded with a conductive paste 608, to a supporting substrate 609 (701 in FIG. 7) of 77 mm×77 mm made of stainless steel. Thereafter, the semiconductor layer at its portion 702 protruded from the supporting substrate was removed by grinding and polishing. After this removal, a tensile force was applied to the interface between the supporting substrate made of stainless steel and the wafer to separate the thin-film semiconductor layer. A porous residue having remained on the thin-film semiconductor layer was removed and an anti-reflection layer was formed. Thus, back-side junction-concentrated type solar cells were produced.

Characteristics of the solar cells were evaluated. As a result, compared with solar cells having the same construction but produced by separating the semiconductor layers without removing their peripheral portions, superior characteristics were obtainable.

Example 5

On one side of a single-crystal wafer of 5 inches diameter, a porous layer was formed in the same manner as in Example 1. Thereafter, on the porous layer, a p$^+$-type semiconductor layer of about 1 μm thick and a p$^-$-type semiconductor layer of 30 μm thick were successively epitaxially grown by liquid-phase growth in the same manner as in Example 4, by immersing the wafer with porous layer in liquid-phase epitaxy solutions in which impurities suited respectively to these layers had been dissolved. Thereafter, a diffusing agent was coated on the surface of the p$^-$-type semiconductor layer, followed by heat treatment to form an n$^+$-type layer.

Subsequently, the n$^+$-type layer, formed on the whole surface, was subjected to isolation in a region 801 (FIG. 8) of 85 mm×85 mm. Then an electrode pattern was printed with a silver paste on the surface of the n$^+$-type layer, and an insulating anti-reflection layer was further deposited thereon.

Figure 8:
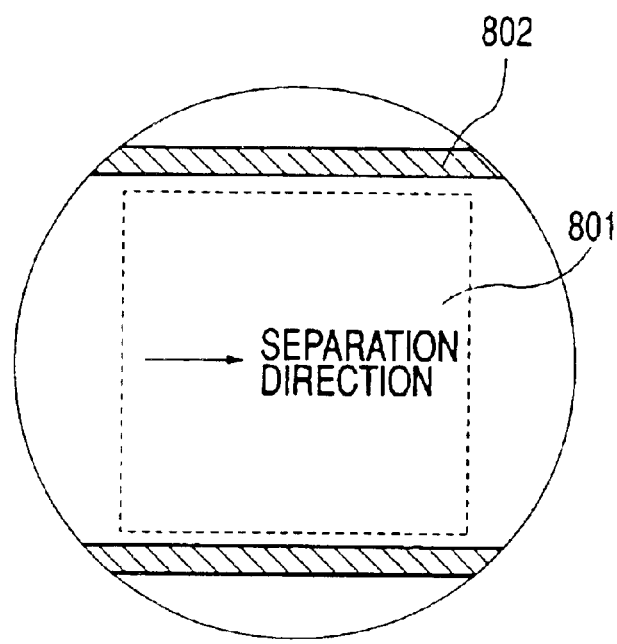
FIG. 8 is a plan view showing an isolation region and a periphery-removing portion of a solar cell formed in Example 5.

Next, using a YAG laser, the semiconductor layer and porous layer were removed in a depth of 45 μm in parallel to a pair of opposing sides of the square region 801 formed by isolation as shown in FIG. 8, and in regions 802 set apart by 5 mm from isolation lines. A transparent adhesive was so coated as not to come around to the portion uncovered after removal with the laser, and a transparent substrate was bonded to the semiconductor layer. Then, force was applied to the substrate to cause separation to progress in the direction parallel to the side regions removed by the laser. Thus, the semiconductor layer was transferred to the transparent substrate, followed by formation of a back electrode to obtain a solar cell.

In the present Example, too, compared with those having the same construction but produced by separating the semiconductor layers without removing their peripheral portions, solar cells having less breaks of thin films and having superior characteristics were obtainable.

Example 6

Figure 9:
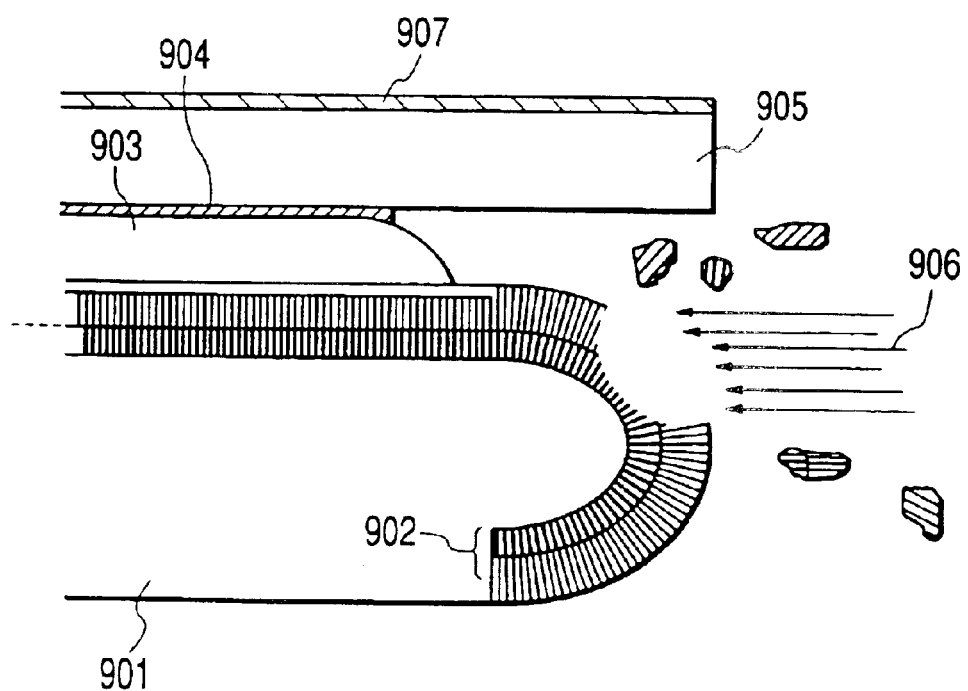
FIG. 9 illustrates a method of removing a porous layer formed at an edge of a wafer, carried out in Example 6.

One side of a single-crystal silicon wafer 901 (FIG. 9) of 1 mm thick and 5 inches diameter was subjected to anodizing under the same conditions as in Example 1 to form a porous layer 902 of 12 μm thick in double-layer structure. The same wafer as the above on one side of which a porous layer was formed in the same way was additionally prepared. These two wafers were closely put together face to face on their side opposite to the side on which the porous layer was formed, and their periphery was covered and fixed with a jig such that any liquid-phase epitaxy solution did not enter their contact surface. These were immersed in a liquid-phase epitaxy solution to grow a p$^-$-type semiconductor layer (silicon layer) 903 epitaxially in a thickness of about 40 μm on each porous layer.

Next, the wafers with these layers were detached from the jig. To the surface of each silicon layer, P (phosphorus) was diffused to form an n$^+$-type layer, and thereafter nine solar-cell regions each having an area of 1 cm$^2$ were fabricated at the central portion of the silicon layer by isolation of the n$^+$-type layer, and an electrode and an anti-reflection layer were further formed.

Subsequently, a glass substrate 905 of the same type as the silicon wafer was bonded with a transparent adhesive 904. Here, the quantity of the adhesive was so controlled that the adhesive did not come around to the edge face of the wafer. Against the edge face of the silicon wafer thus bonded to the glass substrate, a fluid 906 of mixture of fine glass beads with pure water was jetted at a jet-out pressure of 1.0 to 2.0 kg/cm$^2$ by means of a honing apparatus. Thus, the porous layer formed at the edge of the wafer was removed over the whole periphery of the wafer. The glass substrate was provided with a mask tape 907 so as not to be scratched. Thereafter, a wedge made of stainless steel and coated with Teflon was inserted to the porous layer to separate the thin-film semiconductor layer from the silicon wafer at the part of the porous layer. A porous residue having remained on the thin-film semiconductor layer was removed and a back electrode was formed. Thus, solar cells were produced.

Characteristics of the solar cells were evaluated. As a result, compared with solar cells having the same construction but produced by separating the semiconductor layers without removing their peripheral portions, superior characteristics were obtainable.

Example 7

The present Example concerns production of a semiconductor member by transferring a single-crystal silicon layer to a glass substrate according to the process shown in FIGS. 10A to 10H.

Into the surface layer of a silicon wafer 1101 of 5 inches diameter, boron was thermally diffused using BCl$_3$ as a thermal diffusion source at a temperature of 1,200° C. to form a p$^+$-type layer to obtain a diffusion layer 1102 of about 3 μm thick (FIG. 10A). This wafer whose surface layer 1102 became p$^+$-type was subjected to anodizing in an aqueous HF/C$_2$H$_5$OH solution under conditions shown in Table 1 (FIG. 10B). Here, the anodizing was carried out first at a low electric current of 8 mA/cm$^2$ for 2.5 minutes and thereafter, slowly raising the level of electric current on, the anodizing was stopped at the time the electric current reached 35 mA/cm$^2$ in 30 seconds. The porous layer 1103 formed was in a layer thickness of about 3 μm in total.

TABLE 1

| | |
|---|---|
| Anodizing solution | HF:H$_2$O:C$_2$H$_5$OH = 1:1:1 |
| Current density | 8 mA/cm$^2$ → 35 mA/cm$^2$ |
| Anodizing time | 2.5 min. → (30 sec.) → 0 sec. |

This makes it possible to previously provide the porous layer with an internal structural change in density, and later enables easy separation of the silicon layer 1104 from the wafer 1101.

Next, on the surface layer 1103 having been made porous, a silicon layer 1104 was formed in a thickness of 0.5 μm by thermal CVD (FIG. 10C). Here, the peripheral portion of the wafer was in such a state that the silicon layer 1104 covered the top of the porous layer 1103 like that shown in FIG. 3A.

The wafer 1101 with porous layer was set in the anodizing apparatus shown in FIG. 14, at its prescribed position such that the silicon layer 1104 faced a negative electrode 1504 in the aqueous HF solution. Here, the negative electrode 1504 had substantially the same form as a positive electrode 1505 coming in contact with the back of the wafer 1101, and was provided along the periphery of the wafer 1101 in the form of a beltlike ring (see FIG. 16). An electric current of 120 mA/cm$^2$ was flowed across the electrodes in an HF/H$_2$O solution (HF:C$_2$H$_5$OH:H$_2$O=1:1:6) and etching was carried out in an electropolishing mode to remove the silicon layer 1104 and part of the porous layer 1103, lying on the periphery of the wafer 1101, in a depth of 10.5 μm in total (FIG. 10D).

On the surface of the silicon layer 1104, an oxide film 1106 was formed in a thickness of 0.1 μm by normal-pressure CVD at 450° C. Thereafter, a glass substrate 1105 was bonded to the oxide film 1106, and these were put in a heat-treating furnace (not shown) and heated at 1,150° C. to bring the glass substrate 1105 and the silicon layer 1104 on the wafer 1101 into firm bond (FIG. 10E).

Next, force was made to act between the supporting substrate 1105 and the wafer 1101 in the direction where they were pulled apart from each other, to separate them at the part of the porous layer 1103 (FIG. 10F). Neither cracks nor breaks were seen on the periphery of the silicon layer thus separated.

A porous layer 1103a remaining on the silicon layer 1104 separated from the wafer 1101 was selectively removed with a solution of $HF/H_2O$ mixture. Thus, an SOI member was obtained (FIG. 10G).

The wafer 1101 after separation was treated in the same manner as the above to remove a porous layer 1103b remaining on its surface. In a case where the surface was too rough for its flatness to be tolerable, the surface was optionally flatted by polishing or the like (FIG. 10H).

Using the regenerated wafer thus obtained, the above steps were repeated to obtain a plurality of semiconductor (SOI) members having high-quality semiconductor layers.

Example 8

The present Example concerns production of a solar cell by transferring a thin-film single-crystal silicon layer to a polyimide film according to the process shown in FIGS. 11A to 11I.

Into the surface layer of a silicon wafer 1201 of 5 inches diameter, boron was thermally diffused using $BCl_3$ as a thermal diffusion source at a temperature of 1,200° C. to form a $p^+$-type layer to obtain a diffusion layer 1202 of about 3 μm thick (FIG. 11A). This wafer whose surface layer 1202 became $p^+$-type was subjected to anodizing in an aqueous $HF/C_2H_5OH$ solution under conditions shown in Table 2. Here, the anodizing was carried out first at a low electric current of 8 mA/cm² for 10 minutes and thereafter, raising the level of electric current, an electric current was flowed at 30 mA/cm² for 1 minute. The porous layer 1203 formed was in a layer thickness of about 13 μm in total.

TABLE 2

| Anodizing solution | $HF:H_2O:C_2H_5OH = 1:1:1$ |
|---|---|
| Current density | 8 mA/cm² → 30 mA/cm² |
| Anodizing time | 10 min. → (0 sec.) → 1 min. |

Next, on the surface of the porous layer 1203, a silicon layer 1204 was formed in a thickness of 30 μm by epitaxial growth carried out under conditions shown in Table 3, by means of a liquid-phase epitaxy system of a slider type making use of indium as a solvent. Here, boron was added in the solvent in a trace quantity (approximately zero-point-few ppm to few ppm based on the weight of silicon dissolved therein) to make the grown silicon layer 1204 into $p^-$-type and also, after the growth was completed, a $p^+$-type layer 1205 was further formed on grown silicon layer 1204 in a thickness of 1 μm, using another indium melt having a larger boron content (at least hundreds of ppm based on the weight of silicon dissolved therein) (FIGS. 11C, 11D). Here, in relation to a jig on which the substrate was placed, the peripheral portion of the wafer was not in contact with the indium solvent, and hence the silicon layer 1204 did not completely cover the porous layer 1203 like that shown in FIG. 3B and the porous layer 1203 stood uncovered at the surface of the substrate 1201.

TABLE 3

| $H_2$ flow rate | 5 liter/min. |
|---|---|
| Solvent (In) temp. | 950° C. → 830° C. |
| Slow-cooling rate | 1° C./min. |

The wafer 1201 with porous layer was set in the anodizing apparatus shown in FIG. 14, at its prescribed position such that the silicon layer 1204 faced a negative electrode 1504 in the aqueous HF solution. Here, the negative electrode 1504 had substantially the same form as a positive electrode 1505 coming in contact with the back of the wafer 1201, and was provided along the periphery of the wafer 1201 in the form of a beltlike ring (see FIG. 16).

An electric current of 170 mA/cm² was flowed across the electrodes in an $HF/H_2O$ solution ($HF:C_2H_5OH:H_2O=1:1:6$) and etching was carried out in an electropolishing mode to remove the silicon layer 1204 and the whole (layer thickness: 13 μm) of the porous layer 1203, lying on the periphery of the wafer 1201 (FIG. 11E).

On one side of a polyimide film 1206 of 50 μm thick, a silver paste 1207 was coated in a thickness of 10 to 30 μm by screen printing, and this side was brought into close contact with the $p^+$-type silicon layer 1205 side to effect bonding. In this state, these were put in an oven, where the silver paste was sintered under conditions of 360° C. for 20 minutes and also the polyimide film 1206 and the silicon layer 1205 on the wafer 1201 into firm bond (FIG. 11F).

Against the polyimide film 1206 and wafer 1201 brought into a bonded structure, being kept fastened with a vacuum chuck (not shown) on the latter's side not bonded to the former, force was made to act from one edge of the polyimide film 1206. The flexibility of the polyimide film was utilized and the both were slowly drawn off from an edge of the wafer 1201 to effect-separating. Thus, the silicon layers 1204 and 1205 were separated from the wafer 1201 at the part of the porous layer 1203 and transferred onto the polyimide film 1206 (FIG. 11G). Neither cracks nor breaks were seen on the periphery of the silicon layers thus separated.

A porous layer 1203a remaining on the silicon layer 1204 separated from the wafer 1201 was selectively etched with a solution of $HF/H_2O_2/H_2O$ mixture with stirring. The silicon layers remained without being etched and only the porous layer was completely removed.

The surface of the silicon layer 1204 on the polyimide film, thus obtained, was lightly etched with a hydrofluoric acid/nitric acid type etchant to clean it, and thereafter on the silicon layer an n-type μc-Si (microcrystalline silicon) layer was deposited in a thickness of 200 angstroms by means of a conventional plasma CVD system under conditions shown in Table 4. Here, the μc-Si layer had a dark conductivity of ~5 S/cm.

TABLE 4

| Gas flow rate ratio | $SiH_4/H_2$ = 1 cc/20 cc |
|---|---|
| | $PH_3/SiH_4 = 2.0 \times 10^{-3}$ |
| Substrate temperature | 250° C. |
| Pressure | 0.5 Torr |
| Discharge power | 20 W |

Finally, on the μc-Si layer an ITO (indium tin oxide) transparent conductive film 1209 (82 nm) and a collector electrode 1210 (Ti/Pd/Ag: 400 nm/200 nm/1 μm) were formed by EB (electron beam) vacuum deposition to make up a solar cell (FIG. 11H).

In regard to the thin-film single-crystal silicon solar cell on polymide thus obtained, its I-V characteristics under irradiation by light of AM1.5 (100 mW/cm$^2$) were measured. As a result, open-circuit voltage was 0.59 V, short-circuit photoelectric current was 33 mA/cm$^2$ and fill factor was 0.78 at a cell area of 6 cm$^2$, and an energy conversion efficiency of 15.2% was obtained.

Figure 11I:
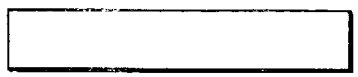

The porous layer remaining on the silicon wafer after separating was also removed by etching in the same manner as the above, and its surface was made flat (FIG. 11I). Using the regenerated wafer thus obtained, the above steps were repeated to obtain a plurality of thin-film single-crystal solar cells having high-quality semiconductor layers.

Example 9

The present Example concerns production of a solar cell by transferring a polycrystalline silicon layer to a Tefzel film (transparent film) according to the process shown in FIGS. 12A to 12I.

Into the surface layer of a rectangular (square) polycrystalline silicon wafer 1301 of 500 μm thick, boron was thermally diffused using BCl$_3$ as a thermal diffusion source at a temperature of 1,200° C. to form a p$^+$-type layer 1302 to obtain a diffusion layer of about 3 μm thick (FIG. 12A). Next, anodizing was carried out in an aqueous HF solution under conditions shown in Table 5, to form a porous silicon layer 1303 at the surface of the wafer (FIG. 12B). More specifically, the anodizing was carried out first at a low electric current of 5 mA/cm$^2$ for 2.5 minutes and thereafter, slowly raising the level of electric current on, the anodizing was stopped at the time the electric current reached 32 mA/cm$^2$ in 30 seconds.

TABLE 5

| | |
|---|---|
| Anodizing solution | HF:H$_2$O:C$_2$H$_5$OH = 1:1:1 |
| Current density | 5 mA/cm$^2$ → 32 mA/cm$^2$ |
| Anodizing time | 2.5 min. → (30 sec.) → 0 sec. |

On the surface of the porous silicon layer, a silicon layer (polycrystalline) was formed in a layer thickness of about 30 μm by crystal growth carried out under conditions shown in Table 6, by means of a conventional thermal CVD system.

TABLE 6

| | |
|---|---|
| Gas flow rate ratio | SiH$_2$Cl$_2$/H$_2$ = 0.5/100 (1/min.) |
| Substrate temperature | 1,050° C. |
| Pressure | normal pressure |
| Growth time | 30 min. |

Here, during the growth, zero-point-few ppm to few ppm of B$_2$H$_6$ was added to make the grown silicon layer into p$^-$-type and also, at the final stage of the growth, hundreds of ppm of PH$_3$ was added in place of B$_2$H$_6$ to form an n$^+$-layer 1305 in a thickness of 0.2 μm to form a p-n junction (FIG. 12C, 12D).

Here, the peripheral portion of the wafer was in such a state that the silicon layer 1304 covered the top of the porous layer 1303 like that shown in FIG. 3A.

The wafer 1301 with porous layer was set in the anodizing apparatus shown in FIG. 15, at its prescribed position such that the silicon layer 1305 faced a negative electrodes 1604 and 1606 in the aqueous HF solution. Here, the negative electrodes 1604 and 1606 had substantially the same form as positive electrodes 1605 and 1607, respectively, coming in contact with the back of the wafer 1301. The electrodes 1604 and 1605 were provided along the periphery of the wafer 1301 in the form of a beltlike rectangle (square) (see FIG. 16). The electrodes 1606 and 1607 were provided inside the electrodes 1604 and 1605, respectively, in the region other than the periphery of the wafer 1301 in the form of a rectangle (square) (see FIG. 17).

An electric current of 150 mA/cm$^2$ was flowed across the electrodes 1604 and 1605 in an HF/H$_2$O solution (HF:C$_2$H$_5$OH:H$_2$O=1:1:6) and etching was carried out in an electropolishing mode to remove the silicon layers 1304 and 1305 and the whole of the porous layer 1303, lying on the periphery of the wafer 1301. Also, an electric current of 8 mA/cm$^2$ was flowed across the electrodes 1604 and 1605 to carry out conventional anodizing to form a thin porous layer 1309 at the surface of the silicon layer 1304 in the region other than the periphery of the wafer 1301, in a thickness of 90 nm and as an anti-reflection layer (FIG. 12E).

After the anodizing was completed, on the anti-reflection layer 1309 an ITO transparent conductive film (not shown) (82 nm) and a collector electrode 1310 (Ti/Pd/Ag: 400 nm/200 nm/1 μm) were formed by EB vacuum deposition to make up a solar cell previously. Thereafter, on one side of a Tefzel film 1306 of 80 μm thick, a transparent adhesive 1307 was coated in a thickness of 10 to 30 μm, and this side was brought into close contact with the transparent conductive film/collector electrode surface to effect bonding (FIG. 12F).

Upon sufficient hardening of the adhesive, the Tefzel film 1306 and wafer 1301 brought into a bonded structure were fastened with a vacuum chuck (not shown) on the latter's side not bonded to the former, in the state of which force was made to act from one edge of the Tefzel film 1306. The flexibility of the Tefzel film was utilized and the both were slowly drawn off from an edge of the wafer 1301 to effect separating. Thus, the silicon layers 1304 and 1305 were separated from the wafer 1301 at the part of the porous layer 1303 and transferred onto the Tefzel film 1306 (FIG. 12G). Neither cracks nor breaks were seen on the periphery of the silicon layers thus separated.

A porous layer 1303a remaining on the silicon layer 1304 separated from the polycrystalline silicon wafer 1301 was selectively etched with an aqueous KOH solution of 1% by weight in concentration with stirring. The silicon layer 1304 remained without being etched so much and the porous layer was completely removed.

On the back of the silicon layer 1304 on the polyimide film, thus obtained, a p-type μc-Si layer was deposited in a thickness of 500 angstroms by plasma CVD under conditions shown in Table 7. Here, the μc-Si layer had a dark conductivity of ~1 S/cm.

TABLE 7

| | |
|---|---|
| Gas flow rate ratio | SiH$_4$/H$_2$ = 1 cc/20 cc |
| | B$_2$H$_6$/SiH$_4$ = 2.0 × 10$^{-3}$ |
| Substrate temperature | 250° C. |
| Pressure | 0.5 Torr |
| Discharge power | 20 W |

As a back electrode 1311, aluminum was also deposited in a thickness of 0.1 μm by sputtering, and a SUS stainless steel substrate (not shown) was further bonded as a supporting substrate via a conductive adhesive to obtain a solar cell (FIG. 12H).

In regard to the thin-film polycrystalline silicon solar cell on Tefzel thus obtained, its I-V characteristics under irradiation by light of AM1.5 (100 mW/cm$^2$) were measured. As a result, open-circuit voltage was 0.59 V, short-circuit photoelectric current was 33.5 mA/cm$^2$ and fill factor was 0.78 at a cell area of 6 cm$^2$, and an energy conversion efficiency of 15.4% was obtained.

The porous layer remaining on the silicon wafer after separating was also removed by etching in the same manner as the above, and its surface was made flat (FIG. 12I). Using the regenerated wafer thus obtained, the above steps were repeated to obtain a plurality of thin-film polycrystalline solar cells having high-quality semiconductor layers.

Example 10

The present Example concerns production of a solar cell according to the process shown in FIGS. 11A to 11I where a form in which the middle area of a disk has been hollowed out in square as shown in FIG. 18 and a form corresponding substantially to the hollowed-out square as shown in FIG. 19 are employed in the electrodes for removing the peripheral portion and the electrodes for forming the anti-reflection layer, respectively.

Into the surface layer of a silicon wafer 1201 of 8 inches diameter, boron was thermally diffused in the same manner as in Examples 7 to 9, using BCl$_3$ as a thermal diffusion source at a temperature of 1,200° C. to form a p$^+$-type layer to obtain a diffusion layer 1202 of about 3 μm thick (FIG. 11A). This wafer whose surface layer 1202 became p$^+$-type was subjected to anodizing in an aqueous HF/C$_2$H$_5$OH solution under conditions shown in Table 2 to form a porous layer 1203 at the surface of the wafer (FIG. 11B). Here, the anodizing was carried out first at a low electric current of 8 mA/cm$^2$ for 10 minutes and thereafter, raising the level of electric current, an electric current was flowed at 30 mA/cm$^2$ for 1 minute. The porous layer 1203 formed was in a layer thickness of about 13 μm in total.

Next, on the surface of the porous silicon layer 1203, a silicon layer 1204 (single crystal) was formed in a layer thickness of about 30 μm by epitaxial growth carried out under conditions shown in Table 6, by means of a conventional thermal CVD system. Here, during the growth, zero-point-few ppm to few ppm of B$_2$H$_6$ was added to make the grown silicon layer into p$^+$-type and also, at the final stage of the growth, the B$_2$H$_6$ was increased to hundreds of ppm or more to form a p$^+$-layer 1205 in a thickness of 1 μm (FIGS. 11C, 11D). Here, the peripheral portion of the wafer was in such a state that the silicon layer 1204 covered the top of the porous layer 1203 like that shown in FIG. 3A.

The wafer 1201 with porous layer was set in the anodizing apparatus shown in FIG. 15, at its prescribed position such that the silicon layer 1205 faced negative electrodes 1604 and 1606 in the aqueous HF solution. Here, the negative electrodes 1604 and 1606 had substantially the same form as positive electrodes 1605 and 1607, respectively, coming in contact with the back of the wafer 1201. The electrodes 1604 and 1605 were provided along the periphery of the wafer 1201 in the form of a disk the middle area of which had been hollowed out in square (see FIG. 18). The electrodes 1606 and 1607 were provided inside the electrodes 1604 and 1605, respectively, in the region other than the periphery of the wafer 1201 in the form corresponding substantially to the hollowed-out square (see FIG. 19).

An electric current of 150 mA/cm$^2$ was flowed across the electrodes 1604 and 1605 in an HF/H$_2$O solution (HF:C$_2$H$_5$OH:H$_2$O=1:1:6) and etching was carried out in an electropolishing mode to remove the silicon layers 1204 and 1205 and the whole of the porous layer 1203, lying on the periphery of the wafer 1201. Also, an electric current of 6 mA/cm$^2$ was flowed across the electrodes 1604 and 1605 to carry out conventional anodizing to form a thin porous layer 1209 at the surface of the silicon layer 1204 in the region other than the periphery of the wafer 1201, in a thickness of 95 nm and as an anti-reflection layer (FIG. 11E).

On one side of a polyimide film 1206 of 50 μm thick, a silver paste 1207 was coated in a thickness of 10 to 30 μm by screen printing, and this side was brought into close contact with the p$^+$-type silicon layer 1205 side to effect bonding. In this state, these were put in an oven, where the silver paste was burnt under conditions of 360° C. for 20 minutes and also the polyimide film 1206 and the silicon layer 1205 on the wafer 1201 into firm bond (FIG. 11F).

To the polyimide film 1206 and wafer 1201 brought into a bonded structure, an energy of ultrasonic waves was applied in a water bath. For example, upon irradiation by ultrasonic waves of 25 kHz and 650 W, the silicon layers were separated from the wafer at the part of the porous layer. Thus, the silicon layers 1204 and 1205 of about 125 mm square were separated from the round wafer of 8 inches diameter and transferred onto the polyimide film 1206 (FIG. 11G). Neither cracks nor breaks were seen on the periphery of the silicon layers thus separated.

A porous layer 1203a remaining on the silicon layer 1204 separated from the wafer 1201 was selectively etched with a solution of HF/H$_2$O$_2$/H$_2$O mixture with stirring. The silicon layers remained without being etched and only the porous layer was completely removed.

The surface of the silicon layer 1204 on the polyimide film, thus obtained, was lightly etched with a hydrofluoric acid/nitric acid type etchant to clean it, and thereafter on the silicon layer an n-type μc-Si layer was deposited in a thickness of 200 angstroms by means of a conventional plasma CVD system under conditions shown in Table 4. Here, the μc-Si layer had a dark conductivity of ~5 S/cm.

Finally, on the μc-Si layer an ITO transparent conductive film 1209 (82 nm) and a collector electrode 1210 (Ti/Pd/Ag: 400 nm/200 nm/1 μm) were formed by EB vacuum deposition to make up a solar cell (FIG. 11H).

In regard to the thin-film single-crystal silicon solar cell on polymide thus obtained, its I-V characteristics under irradiation by light of AM1.5 (100 mW/cm$^2$) were measured. As a result, open-circuit voltage was 0.60 V, short-circuit photoelectric current was 33 mA/cm$^2$ and fill factor was 0.79 at a cell area of 6 cm$^2$, and an energy conversion efficiency of 15.6% was obtained.

The porous layer remaining on the silicon wafer after separating was also removed by etching in the same manner as the above, and its surface was made flat (FIG. 11I). Using the regenerated wafer thus obtained, the above steps were repeated to obtain a plurality of thin-film single-crystal solar cells having high-quality semiconductor layers.

The present invention has specifically been described above by giving Examples. The present invention is by no means construed limitative by the foregoing Examples, and is modifiable in variety. For example, the foregoing description concerns production of solar cells by separating rectangular semiconductor layers from round-wafer type substrates, but the form of the electrodes for removing the peripheral portion and electrodes for forming the anti-reflection layer can be set as desired, and hence semiconductor layers having any desired forms can be separated from substrates having any desired forms.

In all the foregoing Examples, the porous layer is utilized as a separating layer, but a semiconductor member having a separating layer formed by providing a brittle portion in the interior of the wafer can also be treated in quite the same manner as the above, by, e.g., implanting H ions or He ions in the silicon wafer to make heat treatment. Stated specifically, for example, H ions are implanted into the surface portion of the crystal silicon substrate under conditions of 20 keV and $5\times10^{16}$ cm$^{-2}$ to form the brittle layer in a depth of 0.1 μm from the silicon surface, and the silicon layer is formed thereon by thermal CVD in the same manner as in, e.g., Example 7. Thereafter, the removal of peripheral portion, the separating and so forth may be followed up likewise according to the steps of, e.g., FIGS. 10D to 10H.

As having been described above, the present invention has made it possible to obtain in a good efficiency semiconductor members and thin-film crystal solar cells having less cracks or breaks and good characteristics. This has made it possible to provide in the market semiconductor members and solar cells having mass productivity and good quality. The present invention also has made it possible to form through simple steps thin-film crystal solar cells having good characteristics, making it possible to produce inexpensive solar cells. The present invention still also has made it possible to form with ease semiconductor members and thin-film crystal solar cells having any desired forms.

What is claimed is:

1. An anodizing apparatus comprising, at the peripheral portion of a substrate to be subjected to anodizing, a first electrode coming in contact with the back side of the substrate and a second electrode facing the first electrode, interposing the substrate between them; the first electrode having substantially the same beltlike form as the second electrode.

2. The anodizing apparatus according to claim 1, wherein the first and second electrodes each have the form of a beltlike ring or a beltlike polygon.

3. The anodizing apparatus according to claim 1, wherein the second electrode comprises platinum.

4. An anodizing apparatus comprising, at the peripheral portion of a substrate to be subjected to anodizing, a first electrode coming in contact with the back side of the substrate and a second electrode facing the first electrode, interposing the substrate between them, and, in the remaining substrate region excluding the peripheral portion, a third electrode coming in contact with the back side of the substrate and a fourth electrode facing the third electrode, interposing the substrate between them; the first electrode and third electrode having substantially the same form as the second electrode and fourth electrode, respectively.

5. The anodizing apparatus according to claim 4, wherein the first and second electrodes each have the form of a beltlike ring or a beltlike polygon.

6. The anodizing apparatus according to claim 4, wherein the third and fourth electrodes each have the form of a disk or a polygon.

7. The anodizing apparatus according to claim 4, wherein the distance between the first and second electrodes is shorter than the distance between the third and fourth electrodes.

* * * * *

UNITED STATES PATENT AND TRADEMARK OFFICE
CERTIFICATE OF CORRECTION

PATENT NO.    : 6,818,104 B2
DATED         : November 16, 2004
INVENTOR(S)   : Iwasaki et al.

It is certified that error appears in the above-identified patent and that said Letters Patent is hereby corrected as shown below:

Column 17,
Line 37, "$p^+$-type" should read -- $p^-$-type --.
Line 47, "hydrof-" should read -- hydro- --.
Line 48, "luoric" should read -- fluoric --.

Column 18,
Line 35, "extended form" should read -- extended from --.

Signed and Sealed this

Ninth Day of August, 2005

JON W. DUDAS
*Director of the United States Patent and Trademark Office*